(12) United States Patent
Brewer et al.

(10) Patent No.: US 12,199,284 B2
(45) Date of Patent: Jan. 14, 2025

(54) ANODES FOR LITHIUM-BASED ENERGY STORAGE DEVICES, AND METHODS FOR MAKING SAME

(71) Applicant: Graphenix Development, Inc., Williamsville, NY (US)

(72) Inventors: John C. Brewer, Rochester, NY (US); Kevin Tanzil, Rochester, NY (US); Paul D. Garman, Pittsford, NY (US); Robert G. Anstey, Tonawanda, NY (US); Isaac N. Lund, Salinas, CA (US)

(73) Assignee: Graphenix Development, Inc., Williamsville, NY (US)

( * ) Notice: Subject to any disclaimer, the term of this patent is extended or adjusted under 35 U.S.C. 154(b) by 199 days.

(21) Appl. No.: 17/969,010

(22) Filed: Oct. 19, 2022

(65) Prior Publication Data
US 2023/0063959 A1    Mar. 2, 2023

Related U.S. Application Data

(63) Continuation of application No. 16/991,626, filed on Aug. 12, 2020, now Pat. No. 11,508,965.
(Continued)

(51) Int. Cl.
*H01M 4/62* (2006.01)
*H01G 11/26* (2013.01)
(Continued)

(52) U.S. Cl.
CPC .............. *H01M 4/62* (2013.01); *H01G 11/26* (2013.01); *H01G 11/46* (2013.01); *H01G 11/68* (2013.01);
(Continued)

(58) Field of Classification Search
CPC ...... H01M 4/62; H01M 4/0404; H01M 4/133; H01M 4/134; H01M 4/136; H01M 4/382;
(Continued)

(56) References Cited

U.S. PATENT DOCUMENTS 5,567,474 A   10/1996  Dover et al.
5,776,369 A    7/1998  Dover et al.
(Continued)

FOREIGN PATENT DOCUMENTS

WO   2013012334 A1   1/2013
WO   2015175509 A1  11/2015
(Continued)

OTHER PUBLICATIONS

Amine, et al., "Novel Chemistry: Lithium Selenium and Selenium Sulfur Couple", Project ES280, Available Online at: https://www.energy.gov/sites/prod/files/2016/06/f32/es280_amine_2016_p_web.pdf, 2016, 22 pages.
(Continued)

*Primary Examiner* — Stewart A Fraser
(74) *Attorney, Agent, or Firm* — David D. Hsu; Polsinelli LLP

(57) ABSTRACT

A prelithiated anode may include a current collector may include a metal oxide layer. Prelithiated anodes may in addition include a lithiated storage layer overlaying the metal oxide layer. The lithiated storage layer may be formed by incorporating lithium into a continuous porous lithium storage layer may include at least 80 atomic % silicon. The lithiated storage layer may include less than 1% by weight of carbon-based binders. The lithiated storage layer may further include lithium in a range of 1% to 90% of a theoretical lithium storage capacity of the continuous porous lithium storage layer. Batteries may include the prelithiated anode.

19 Claims, 11 Drawing Sheets

Related U.S. Application Data

(60) Provisional application No. 62/886,177, filed on Aug. 13, 2019.

(51) Int. Cl.
| | |
|---|---|
| *H01G 11/46* | (2013.01) |
| *H01G 11/68* | (2013.01) |
| *H01M 4/04* | (2006.01) |
| *H01M 4/133* | (2010.01) |
| *H01M 4/134* | (2010.01) |
| *H01M 4/136* | (2010.01) |
| *H01M 4/38* | (2006.01) |
| *H01M 4/485* | (2010.01) |
| *H01M 4/525* | (2010.01) |
| *H01M 4/58* | (2010.01) |
| *H01M 4/64* | (2006.01) |
| *H01M 4/66* | (2006.01) |
| *H01M 10/0525* | (2010.01) |
| *H01M 4/02* | (2006.01) |

(52) U.S. Cl.
CPC ....... *H01M 4/0404* (2013.01); *H01M 4/0428* (2013.01); *H01M 4/0452* (2013.01); *H01M 4/0471* (2013.01); *H01M 4/133* (2013.01); *H01M 4/134* (2013.01); *H01M 4/136* (2013.01); *H01M 4/382* (2013.01); *H01M 4/386* (2013.01); *H01M 4/485* (2013.01); *H01M 4/525* (2013.01); *H01M 4/58* (2013.01); *H01M 4/64* (2013.01); *H01M 4/661* (2013.01); *H01M 4/664* (2013.01); *H01M 10/0525* (2013.01); *H01M 2004/021* (2013.01); *H01M 2004/027* (2013.01)

(58) Field of Classification Search
CPC ...... H01M 4/386; H01M 4/485; H01M 4/525; H01M 4/58; H01M 4/64; H01M 4/661; H01M 4/664; H01M 10/0525; H01M 2004/027; H01M 4/366; H01M 4/483
See application file for complete search history.

(56) References Cited

U.S. PATENT DOCUMENTS

| | | | |
|---|---|---|---|
| 5,976,403 | A | 11/1999 | Dover et al. |
| 6,761,744 | B1 | 7/2004 | Tsukamoto et al. |
| 6,911,280 | B1 | 6/2005 | De Jonghe et al. |
| 7,378,041 | B2 | 5/2008 | Asao et al. |
| 7,410,728 | B1 | 8/2008 | Fujimoto et al. |
| 7,413,982 | B2 | 8/2008 | Levy |
| 7,767,341 | B2 | 8/2010 | Kogetsu et al. |
| 8,257,866 | B2 | 9/2012 | Loveness et al. |
| 8,377,236 | B2 | 2/2013 | Yakovleva et al. |
| 8,906,523 | B2 | 12/2014 | Brantner |
| 9,257,704 | B2 | 2/2016 | Balu et al. |
| 9,281,515 | B2 | 3/2016 | Nazri |
| 9,293,771 | B2 | 3/2016 | Tani et al. |
| 9,325,014 | B2 | 4/2016 | Lee et al. |
| 9,376,455 | B2 | 6/2016 | Lee et al. |
| 9,531,004 | B2 | 12/2016 | Xiao et al. |
| 10,008,717 | B2 | 6/2018 | Suzuki et al. |
| 10,014,552 | B1 | 7/2018 | Shnitser et al. |
| 10,115,960 | B2 | 10/2018 | Lee et al. |
| 10,164,252 | B2 | 12/2018 | Yang et al. |
| 10,236,502 | B2 | 3/2019 | Kuriki et al. |
| 10,686,214 | B2 | 6/2020 | Liu et al. |
| 10,910,653 | B2 | 2/2021 | Brewer et al. |
| 11,024,842 | B2 | 6/2021 | O'Toole et al. |
| 11,094,925 | B2 * | 8/2021 | Venkatachalam ..... H01M 4/587 |
| 11,283,079 | B2 | 3/2022 | Brewer et al. |
| 2004/0131943 | A1 | 7/2004 | Brown et al. |
| 2004/0191630 | A1 | 9/2004 | Kawamura et al. |
| 2005/0031958 | A1 | 2/2005 | Fukuoka et al. |
| 2006/0110661 | A1 | 5/2006 | Lee et al. |
| 2006/0110662 | A1 | 5/2006 | Konishiike et al. |
| 2006/0216604 | A1 | 9/2006 | Kawase et al. |
| 2007/0207381 | A1 | 9/2007 | Ohtsuka et al. |
| 2009/0061326 | A1 | 3/2009 | Hirose et al. |
| 2009/0162750 | A1 | 6/2009 | Kawakami et al. |
| 2010/0040951 | A1 | 2/2010 | Yamamoto et al. |
| 2010/0119948 | A1 | 5/2010 | Hasegawa et al. |
| 2010/0216026 | A1 | 8/2010 | Lopatin et al. |
| 2010/0233534 | A1 | 9/2010 | Iwama et al. |
| 2010/0285358 | A1 | 11/2010 | Cui et al. |
| 2010/0297502 | A1 | 11/2010 | Zhu et al. |
| 2010/0330421 | A1 | 12/2010 | Cui et al. |
| 2011/0111304 | A1 | 5/2011 | Cui et al. |
| 2011/0114254 | A1 | 5/2011 | Xu et al. |
| 2011/0159365 | A1 | 6/2011 | Loveness et al. |
| 2011/0266654 | A1 | 11/2011 | Kuriki et al. |
| 2012/0077082 | A1 | 3/2012 | Se-Hee et al. |
| 2012/0121983 | A1 | 5/2012 | Yoon et al. |
| 2013/0143124 | A1 | 6/2013 | Lee et al. |
| 2014/0011088 | A1 | 1/2014 | Lopatin et al. |
| 2014/0248543 | A1 | 9/2014 | Zhu et al. |
| 2014/0335411 | A1 | 11/2014 | Liu et al. |
| 2015/0072119 | A1 | 3/2015 | George et al. |
| 2015/0104718 | A1 | 4/2015 | Chen |
| 2015/0118572 | A1 | 4/2015 | Lund et al. |
| 2015/0180023 | A1 | 6/2015 | Xiao et al. |
| 2015/0325852 | A1 | 11/2015 | Wang et al. |
| 2016/0190564 | A1 | 6/2016 | Samarao et al. |
| 2016/0197351 | A1 | 7/2016 | Tani et al. |
| 2016/0285081 | A1 | 9/2016 | Matsuno et al. |
| 2016/0351973 | A1 | 12/2016 | Albano et al. |
| 2017/0133662 | A1 | 5/2017 | Cui et al. |
| 2017/0279163 | A1 | 9/2017 | Jang et al. |
| 2017/0301616 | A1 | 10/2017 | Biederman et al. |
| 2017/0335482 | A1 | 11/2017 | Date et al. |
| 2017/0338464 | A1 | 11/2017 | Fasching et al. |
| 2018/0083264 | A1 | 3/2018 | Soppe |
| 2018/0123132 | A1 | 5/2018 | Kawakami et al. |
| 2018/0145367 | A1 | 5/2018 | Busacca et al. |
| 2018/0166735 | A1 | 6/2018 | Busacca et al. |
| 2018/0287130 | A1 | 10/2018 | de Souza et al. |
| 2019/0044151 | A1 | 2/2019 | Elam et al. |
| 2019/0058198 | A1 | 2/2019 | Fan et al. |
| 2019/0097275 | A1 | 3/2019 | Mitlin et al. |
| 2019/0103231 | A1 | 4/2019 | Chai et al. |
| 2019/0140267 | A1 | 5/2019 | Gopalakrishnan Nair et al. |
| 2019/0198865 | A1 | 6/2019 | Kim et al. |
| 2019/0207205 | A1 | 7/2019 | Adair et al. |
| 2019/0267631 | A1 | 8/2019 | Brewer et al. |
| 2020/0411851 | A1 | 12/2020 | O'Toole et al. |
| 2021/0242456 | A1 | 8/2021 | O'Toole et al. |

FOREIGN PATENT DOCUMENTS

| | | |
|---|---|---|
| WO | 2016057426 A1 | 4/2016 |
| WO | 2016112333 A1 | 7/2016 |
| WO | 2019165412 A1 | 8/2019 |
| WO | 2020039609 A1 | 2/2020 |
| WO | 2021029769 A1 | 2/2021 |
| WO | 2021241130 A1 | 12/2021 |

OTHER PUBLICATIONS

Beattie, et al., "Understanding Capacity Fade in Silicon Based Electrodes for Lithium-Ion Batteries Using Three Electrode Cells and Upper Cut-off Voltage Studies", Science Direct, Journal of Power Sources, vol. 302, 2016, pp. 426-430.

Cho, et al., "Electrochemical Properties of Si Film Electrodes Grown on Current Collectors with CuO Nanostructures for Thin-Film Microbatteries", Journal of Nanoscience and Nanotechnology, vol. 14, No. 12, 2014, pp. 9300-9306.

Cho, et al., "Enhanced Lithium Ion battery Cycling of Silicon Nanowire Anodes by Template Growth to Eliminate Silicon Underlayer Islands", NANO Letters, vol. 13, No. 11, 2013, pp. 5740-5747.

(56) References Cited

OTHER PUBLICATIONS

Christopherson, "Battery Test Manual for Electric Vehicles, Revision 3", Idaho National Lab, Jun. 1, 2015, pp. 1-3.
Corte, "Effets Du Traitement Chimique De La Surface D'une Électrode Négative en Silicium Amorphe Pour Batterie Lithium-ion: Étude Par Spectroscopie Infrarouge in Situ", Ecole Polytechnique Paristech, 2013, pp. 1-139.
Domi, et al., "Effect of Mechanical Pre-Lithiation on Electrochemical Performance of Silicon Negative Electrode for Lithium-Ion Batteries", Journal of The Electrochemical Society, vol. 164, No. 7, 2017, pp. A1651-A1654.
Fang, et al., "Dual-Design of Nanoporous to Compact Interface via Atomic/Molecular Layer Deposition Enabling a Long-Life Silicon Anode", Advanced Functional Materials, vol. 32, No. 7, Feb. 2021, 21 pages.
Fotouhi, et al., "Lithium-Sulfur Battery Technology Readiness and Applications—A Review", Energies, vol. 10, No. 12, Nov. 2017, pp. 1-15.
Gomez-Baquero, "Silicon Anodes to Enable Better Lithium Ion Batteries", ResearchGate, Besstect LLC, Apr. 2016, pp. 1-28.
He, et al., "Alumina-Coated Patterned Amorphous Silicon as the Anode for a Lithium-Ion Battery with High Coulombic Efficiency", Advanced Materials, vol. 23, No. 42, Nov. 2011, pp. 4938-4941.
Holstiege, et al., "Pre-Lithiation Strategies for Rechargeable Energy Storage Technologies: Concepts, Promises and Challenges", Batteries, vol. 4, No. 4, 2018, pp. 1-39.
Kim, et al., "Electrochemical Characteristics of Si/Mo Multilayer Anode for Li ion Batteries", Revista Mexicana De Fisica, vol. 53, No. 1, 2007, pp. 17-20.
Kozen, et al., "Atomic Layer Deposition of the Solid Electrolyte LiPON", Chemistry of Materials, vol. 27, 2015, pp. 5324-5331.
Kundu, et al., "Structural Studies of Copper Sulfide Films: Effect of Ambient Atmosphere", Science and Technology of Advanced Materials, vol. 9, No. 3, 2008, pp. 1-6.
Lee, et al., "Atomic Layer Deposition for Stabilization of Silicon Anodes", National Renewable Energy Laboratory Report, Jun. 17, 2014, 25 pages.
Lee, et al., "Growth and Properties of Hybrid Organic-Inorganic Metalcone Films Using Molecular Layer Deposition Techniques", Advanced Functional Materials, vol. 23, No. 5, 2013, pp. 532-546.
Li, et al., "Artificial Solid Electrolyte Interphase to Address the Electrochemical Degradation of Silicon Electrodes", ACS Applied Materials & Interfaces, vol. 6, No. 13, 2014, pp. 10083-10088.
Li, et al., "One-Step Synthesis of Li-Doped NiO as High-Performance Anode Material for Lithium Ion Batteries", Ceramics International, vol. 42, No. 13, 2016, pp. 14565-14572.
Lin, et al., "Lithium Superionic Sulfide Cathode for All-Solid Lithium-Sulfur Batteries", American Chemical Society Nano, vol. 7, No. 3, 2013, pp. 2829-2833.
Lin, et al., "Optical Characterization of Hydrogenated Amorphous Silicon Thin Films Deposited at High Rate", Journal of Electronic Materials, vol. 28, No. 12, 1999, pp. 1452-1456.
Lin, et al., "Reviving the Lithium Metal Anode for High-Energy Batteries", Nature Nanotechnology, vol. 12, Mar. 2017, pp. 194-206.
Nguyen, et al., "Alumina-Coated Silicon-Based Nanowire Arrays for High Quality Li-Ion Battery Anodes", Journal of Materials Chemistry, vol. 22, No. 47, 2012, pp. 24618-24626.
Nominanda, et al., "Process and Material Properties of PECVD Boron-Doped Amorphous Silicon Film", Available Online at: https://www.electrochem.org/dl/ma/201/pdfs/0399.pdf, 2002, 1 page.
Notten, "Advanced Energy Storage Materials for Battery Applications, Advanced Materials", NL Agency Ministry of Economic Affairs, Agriculture and Innovation, Dec. 12, 2012, 50 pages.
Pearse, et al., "Nanoscale Solid State Batteries Enabled by Thermal Atomic Layer Deposition of a Lithium Polyphosphazene Solid State Electrolyte", Chemistry of Materials, vol. 29, No. 8, Mar. 30, 2017, 31 pages.
Quiroga-Gonzalez, et al., "Optimal Conditions for Fast Charging and Long Cycling Stability of Silicon Microwire Anodes for Lithium Ion Batteries, and Comparison with the Performance of Other Si Anode Concepts", Energies, vol. 6, No. 10, 2013, pp. 5145-5156.
Sakabe, et al., "Porous Amorphous Silicon Film Anodes for High-Capacity and Stable All-Solid-State Lithium Batteries", Communications Chemistry, vol. 1, 2018, 9 pages.
Salah, et al., "Pure Silicon Thin-Film Anodes for Lithium-Ion Batteries: A Review", Journal of Power Sources, vol. 414, Feb. 28, 2019, pp. 48-67.
Soppe, et al., "Self-Organized Nano-Structures Silicon as Anode Material for Li-Ion Batteries", Meeting of Materials Research Society, Apr. 2-6, 2018, 1 page.
Stefan, "A Commercially Scalable Process for Silicon Anode Prelithiation", DOE Merit Review, Amprius Incorporated, Project ES250, Available Online at: https://www.energy.gov/sites/prod/files/2016/06/f32/es250_stefan_2016_o_web.pdf, Jun. 6-10, 2016, pp. 1-23.
Sun, "Nanomembranes Based on Nickel Oxide and Germanium as Anode Materials for Lithium-Ion Batteries", Dissertation, Sep. 27, 2017, 116 pages.
Uehara, et al., "Thick Vacuum Deposited Silicon Films Suitable for the Anode of Li-Ion Battery", Journal of Power Sources, Science Direct, vol. 146, No. 1-2, 2005, pp. 441-444.
Ulvestad, et al., "Silicon Nitride as Anode Material for Li-Ion Batteries: Understanding the SiNx Conversion Reaction", Journal of Power Sources, vol. 399, 2018, pp. 414-421.
Ulvestad, et al., "Silicon Nitride Coated Silicon Thin Films as Anodes for Li-Ion Batteries", Electronic Clearing Service Transactions, vol. 64, No. 22, 2015, pp. 107-111.
Valladares, et al., "Characterization of Ni Thin Films Following Thermal Oxidation in Air", Journal of Science Technology B, vol. 32, No. 5, 2014, pp. 051808-1-051808-8.
Wu, et al., "Silicon Nitride Coated Silicon Thin Film on Three Dimensions Current Collector for Lithium Ion Battery Anode", Journal of Power Sources, vol. 325, 2016, pp. 64-70.
Xu, et al., "A High-Performance Li-Ion Anode From Direct Deposition of Si Nanoparticles", Nano Energy, vol. 38, 2017, pp. 477-485.
Xu, et al., Supplemental Info "A High-Performance Li-ion Anode from Direct Deposition of Si Nanoparticles", Nano Energy, vol. 38, 477-485.
Xu, et al., "Engineering the Direct Deposition of Si Nanoparticles for Improved Performance in Li-Ion Batteries", Journal of the Electrochemical Society, vol. 166, No. 3, 2018, pp. A5252-A5258.
Yang, "Development of Silicon-Based Anodes and In-Situ Characterization Techniques for Lithium Ion Batteries", Jinho Yang Dissertation, Wayne State University, 2014, 125 pages.
Yuan, et al., "High-Performance CuO/Cu Composite Current Collectors with Array-Pattern Porous Structures For Lithium-Ion Batteries", Electrochimica Acta, vol. 226, 2017, pp. 89-97.
Zhao, et al., "A General Prelithiation Approach for Group IV Elements and Corresponding Oxides", Energy Storage Materials, 2017, pp. 1-7.
Zhu, et al., "Achieving High-Performance Silicon Anodes of Lithium-Ion Batteries via Atomic and Molecular Layer Deposited Surface Coatings: An Overview", Electrochimica Acta, vol. 251, No. 1, 2017, pp. 710-728.
Application No. PCT/US2019/019531, International Search Report and Written Opinion, Mailed On Jun. 13, 2019, 10 pages.
Application No. PCT/US2019/019531, International Preliminary Report on Patentability, Mailed On Sep. 3, 2020, 8 pages.
Application No. PCT/US2020/039386, International Search Report and Written Opinion, Mailed On Sep. 25, 2020, 7 pages.
PCT/US2020/045963, "Invitation To Pay Additional Fees And, Where Applicable, Protest Fee", Oct. 19, 2020, 2 pages.
Application No. PCT/US2020/046970, International Search Report and Written Opinion, Mailed On Nov. 9, 2020, 8 pages.
Application No. PCT/US2020/045963, International Search Report and Written Opinion, Mailed On Dec. 29, 2020, 12 pages.
Application No. PCT/US2021/026179, International Search Report and Written Opinion, Mailed On Jul. 9, 2021, 9 pages.
Application No. PCT/US2020/039386, International Preliminary Report on Patentability, Mailed On Jan. 6, 2022, 6 pages.
Application No. PCT/US2020/045963, International Preliminary Report on Patentability, Mailed On Feb. 24, 2022, 9 pages.

(56) References Cited

OTHER PUBLICATIONS

Application No. PCT/US2020/046970, International Preliminary Report on Patentability, Mailed On Mar. 3, 2022, 7 pages.
Application No. PCT/US2021/064018, International Search Report and Written Opinion, Mailed On Mar. 7, 2022, 9 pages.
U.S. Appl. No. 16/991,623, Non-Final Office Action, Mailed On Sep. 6, 2022, 11 pages.
U.S. Appl. No. 16/991,623, Final Office Action, Mailed On Dec. 12, 2022, 13 pages.
U.S. Appl. No. 17/873,477, Non-Final Office Action, Mailed On Jan. 16, 2024, 11 pages.

* cited by examiner

ANODES FOR LITHIUM-BASED ENERGY STORAGE DEVICES, AND METHODS FOR MAKING SAME

CROSS REFERENCE TO RELATED APPLICATION

This application is a continuation of U.S. patent application Ser. No. 16/991,626, filed Aug. 12, 2020, which claims the benefit of U.S. Provisional Application No. 62/886,177, filed Aug. 13, 2019, the contents of which are hereby incorporated by reference in their entirety for all purposes.

TECHNICAL FIELD

The present disclosure relates to lithium ion batteries and related energy storage devices.

BACKGROUND

Silicon has been proposed as a potential material for lithium-ion batteries to replace the conventional carbon-based anodes which have a storage capacity that is limited to ~370 mAh/g. Silicon readily alloys with lithium and has a much higher theoretical storage capacity (~3600 to 4200 mAh/g at room temperature) than carbon-based anodes. However, insertion and extraction of lithium into the silicon matrix causes significant volume expansion (>300%) and contraction. This can result in rapid pulverization of the silicon into small particles and electrical disconnection from the current collector.

The industry has recently turned its attention to nano- or micro-structured silicon to reduce the pulverization problem, i.e., silicon in the form of spaced apart nano- or micro-wires, tubes, pillars, particles and the like. The theory is that making the structures nano-sized avoids crack propagation and spacing them apart allows more room for volume expansion, thereby enabling the silicon to absorb lithium with reduced stresses and improved stability compared to, for example, macroscopic layers of bulk silicon.

Despite research into structured silicon approaches, such batteries based solely on silicon have yet to make a large market impact due to unresolved problems. A significant issue is the manufacturing complexity and investment required to form these anodes. For example, US20150325852 describes silicon made by first growing a silicon-based, non-conformal, porous layer on a nanowire template by plasma-enhanced chemical vapor deposition (PECVD) followed by deposition of a denser, conformal silicon layer using thermal chemical vapor deposition (CVD). Formation of silicon nanowires can be very sensitive to small perturbations in deposition conditions making quality control and reproducibility a challenge. Other methods for forming nano- or micro-structured silicon use etching of silicon wafers, which is time-consuming and wasteful. Further, the connection between silicon wires to a current collector is inherently fragile and the structures are prone to break or abrade away when subjected to handling stresses needed to manufacture a battery.

SUMMARY

There remains a need for anodes for lithium-based energy storage devices such as Li-ion batteries that are easy to manufacture, robust to handling, high in charge capacity and amenable to fast charging, for example, at least 1 C. These and other needs are addressed by the embodiments described herein.

In accordance with another embodiment of this disclosure, a method of making a prelithiated anode for use in a lithium-ion battery includes providing a current collector having an electrically conductive layer and a metal oxide layer overlaying the electrically conductive layer. The metal oxide layer has an average thickness of at least 0.01 µm. A continuous porous lithium storage layer is deposited onto the metal oxide layer by a CVD process. Lithium is incorporated into the continuous porous lithium storage layer to form a lithiated storage layer prior to a first electrochemical cycle when the anode is assembled into the battery. The anode may be incorporated into a lithium ion battery along with a cathode. The cathode may include sulfur or selenium and the anode may be prelithiated.

The present disclosure provides anodes for energy storage devices that may have one or more of at least the following advantages relative to conventional anodes: improved stability at aggressive ≥1 C charging rates; higher overall areal charge capacity; higher charge capacity per gram of silicon; improved physical durability; simplified manufacturing process; and more reproducible manufacturing process.

DETAILED DESCRIPTION

It is to be understood that the drawings are for purposes of illustrating the concepts of the disclosure and may not be to scale.

Anode Overview

Figure 1:
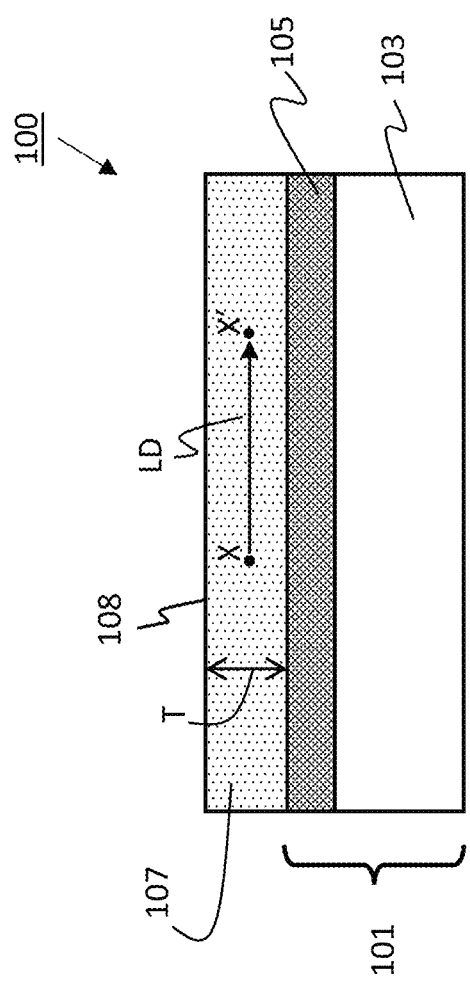
FIG. 1 is a cross-sectional view of an anode according to some embodiments of the present disclosure.

FIG. 1 is a cross-sectional view according to some embodiments of the present disclosure. Anode 100 includes an electrically conductive current collector 101 and a continuous porous lithium storage layer 107. In this embodiment, the electrically conductive current collector 101 includes a metal oxide layer 105 provided over an electrically conductive layer 103, for example an electrically conductive metal layer. The continuous porous lithium storage layer 107 is provided over metal oxide layer 105. In some embodiments, the top of the continuous porous lithium storage layer 107 corresponds to a top surface 108 of anode 100. In some embodiments the continuous porous lithium storage layer 107 is in physical contact with the metal oxide layer. In some embodiments, the active material of the continuous porous lithium storage layer may extend partially into the metal oxide layer. In some embodiments the continuous porous lithium storage layer includes a material capable of forming an electrochemically reversible alloy with lithium. In some embodiments, the continuous porous lithium storage layer includes silicon, germanium, tin or alloys thereof. In some embodiments the continuous porous lithium storage layer comprises at least 40 atomic % silicon, germanium or a combination thereof. In some embodiments, the continuous porous lithium storage layer is provided by a chemical vapor deposition (CVD) process including, but not limited to, hot-wire CVD or a plasma-enhanced chemical vapor deposition (PECVD). In some embodiments, the CVD storage layer deposition process may reduce a portion of the metal oxide layer to metal.

Figure 2:
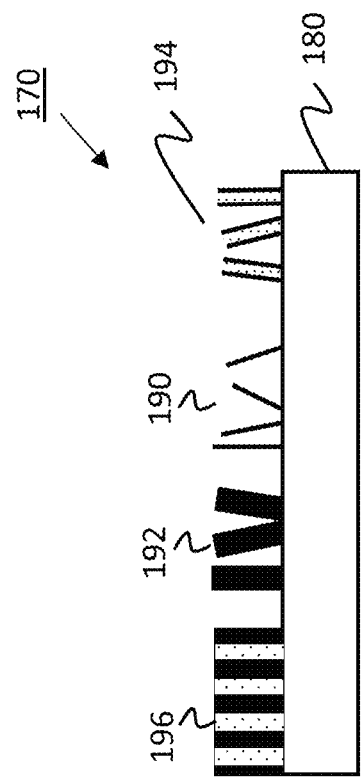
FIG. 2 is a cross-sectional view of a prior art anode.

In the present disclosure, the continuous porous lithium storage layer is substantially free of nanostructures, e.g., in the form of spaced-apart wires, pillars, tubes or the like, or in the form of regular, linear vertical channels extending through the lithium storage layer. FIG. 2 shows a cross-sectional view of a prior art anode 170 that includes some non-limiting examples of nanostructures, such as nanowires 190, nanopillars 192, nanotubes 194 and nanochannels 196 provided over a current collector 180. The term "nanostructure" herein generally refers to an active material structure (for example, a structure of silicon, germanium or their alloys) having at least one cross-sectional dimension that is less than about 2,000 nm, other than a dimension approximately normal to an underlying substrate (such as a layer thickness) and excluding dimensions caused by random pores and channels. Similarly, the terms "nanowires", "nanopillars" and "nanotubes" refers to wires, pillars and tubes, respectively, at least a portion of which, have a diameter of less than 2,000 nm. "High aspect ratio" nanostructures have an aspect ratio greater than 4:1, where the aspect ratio is generally the height or length of a feature (which may be measured along a feature axis aligned at an angle of 45 to 90 degrees relative to the underlying current collector surface) divided by the width of the feature (which may be measured generally orthogonal to the feature axis). In some embodiments, the continuous porous lithium storage layer is considered "substantially free" of nanostructures when the anode has an average of fewer than 10 nanostructures per 1600 square microns (in which the number of nanostructures is the sum of the number of nanowires, nanopillars, and nanotubes in the same unit area), such nanostructures having an aspect ratio of 4:1 or higher. Alternatively, there is an average of fewer than 1 such nanostructures per 1600 square micrometers. As noted below, the current collector may have a high surface roughness or the surface layer may include nanostructures, but these features are separate from the continuous porous lithium storage layer.

In some embodiments, deposition conditions are selected in combination with the metal oxide so that the continuous porous lithium storage layer is relatively smooth providing an anode with diffuse or total reflectance of at least 10% at 550 nm, alternatively at least 20% (measured at the continuous porous lithium storage layer side). In some embodiments, the anode may have lower reflectance than cited above, for example, by providing a current collector having a rough surface or by modifying deposition conditions of the lithium storage layer.

The anode can be a continuous foil or sheet but can alternatively be a mesh or have some other 3-dimensional structure. In some embodiments, the anode is flexible.

Figure 3:
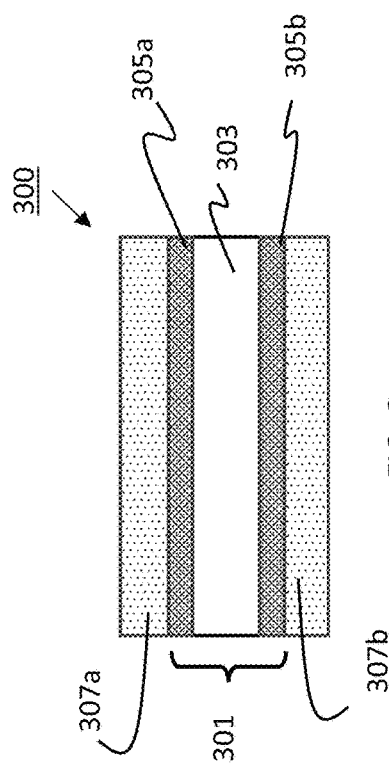
FIG. 3 is a cross-sectional view of an anode according to some embodiments of the present disclosure.

In some embodiments as shown in FIG. 3, the current collector 301 includes electrically conductive layer 303 and metal oxide layers (305a, 305b) deposited on either side of the electrically conductive layer 303 and continuous porous lithium storage layers (307a, 307b) are disposed on both sides to form anode 300. Metal oxide layers 305a and 305b may be the same or different with respect to composition, thickness, porosity or some other property. Similarly, continuous porous lithium storage layers 307a and 307b may be the same or different with respect to composition, thickness, porosity or some other property.

Figure 4:
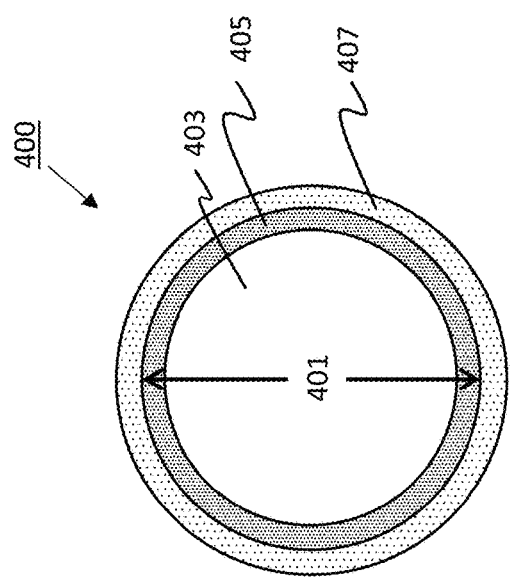
FIG. 4 is a cross-sectional view of an anode according to some embodiments of the present disclosure.

In some embodiments, the current collector has a mesh structure and a representative cross section is shown in FIG. 4. Current collector 401 includes metal oxide layer 405 substantially surrounding the inner, electrically conductive core 403, e.g., a wire forming part of the mesh, the core acting as an electrically conductive layer. A continuous porous lithium storage layer 407 is provided over the metal oxide layer to form anode 400. The mesh can be formed from interwoven wires or ribbons of metal or conductive carbon, formed by patterning holes into a substrate, e.g., a metal or metal-coated sheet, or any suitable method known in the art.

Current Collector

Current collector (101, 301, 401) includes at least one metal oxide layer (105, 305, 405), and may further include a separate electrically conductive layer (103, 303, 403). The metal oxide may be stoichiometric or non-stoichiometric. The metal oxide layer may include a mixture of metal oxides having homogeneously or heterogeneously distributed oxide stoichiometries, mixtures of metals or both. If the metal oxide layer (105, 305, 405) has sufficient electrical conductivity to function as a current collector, the separate electrically conductive layer (103, 303, 403) is optional. In embodiments using an electrically conductive layer, the metal oxide layer should be sufficiently electrically conductive (e.g., is at least semi-conducting, or non-insulating) to allow transfer of electrical charge between the electrically conductive layer and the continuous porous lithium storage layer. The metal oxide layer may include dopants or regions of unoxidized metal that promote electrical conductivity. In some embodiments the electrically conductive layer may have a conductivity of at least $10^3$ S/m, or alternatively at least $10^6$ S/m, or alternatively at least $10^7$ S/m, and may include inorganic or organic conductive materials or a combination thereof.

In some embodiments, the electrically conductive layer includes a metallic material, e.g., titanium (and its alloys), nickel (and its alloys), copper (and its alloys), or stainless steel. In some embodiments, the electrically conductive layer includes an electrically conductive carbon, such as carbon black, carbon nanotubes, graphene, graphene oxide, reduced graphene oxide, and graphite. In some embodiments the electrically conductive layer may be in the form of a foil or sheet of conductive material, or alternatively a layer deposited onto an insulating substrate (e.g., a polymer sheet coated with conductive material such as nickel or copper, optionally on both sides).

In some embodiments, the metal oxide layer includes a transition metal oxide, e.g., an oxide of nickel, titanium or copper. In some embodiments, the metal oxide layer includes an oxide of aluminum. In some embodiments, the metal oxide layer is an electrically conductive doped oxide, including but not limited to, indium-doped tin oxide (ITO) or an aluminum-doped zinc oxide (AZO). In some embodiments, the metal oxide layer includes an alkali metal oxide or alkaline earth metal oxide. In some embodiments the metal oxide layer includes an oxide of lithium. As mentioned, the metal oxide layer may include mixtures of metals. For example, an "oxide of nickel" may optionally include other metals in addition to nickel. In some embodiments, the metal oxide layer includes an oxide of an alkali metal or an alkaline earth metal (e.g., lithium or sodium) along with an oxide of a transition metal (e.g., nickel or copper). In some embodiments, the metal oxide layer may include a small amount of hydroxide such that the ratio of oxygen atoms in the form of hydroxide relative to oxide is less than 0.25, respectively.

In some embodiments, the metal oxide layer has an average thickness of at least 0.005 µm, alternatively at least 0.01 µm, alternatively at least 0.02 µm, alternatively at least 0.05 µm, alternatively 0.1 µm, alternatively at least 0.2 µm, alternatively at least 0.5 µm. In some embodiments, the metal oxide layer has an average thickness in a range of about 0.005 µm to about 0.01 µm, alternatively about 0.01 µm to about 0.02 µm, alternatively about 0.02 µm to about 0.05 µm, alternatively about 0.05 µm to about 0.1 µm, alternatively about 0.1 µm to about 0.2 µm, alternatively about 0.2 µm to about 0.5 µm, alternatively about 0.5 µm to about 1 µm, alternatively about 1 µm to about 2 µm, alternatively about 2 µm to about 5 µm, alternatively about 5 µm to about 1 µm, or any combination of contiguous ranges thereof.

The metal oxide layer may include a stoichiometric oxide, a non-stoichiometric oxide or both. In some embodiments, the metal within the metal oxide layer may exist in multiple oxidation states. In some embodiments the metal oxide layer may have a gradient of oxygen content where the atomic % of oxygen adjacent to an electrically conductive layer is lower than the atomic % adjacent to the lithium storage layer.

In some embodiments, the metal oxide layer is formed directly by atomic layer deposition (ALD), CVD, evaporation or sputtering. In some embodiments, the electrically conductive layer is a metal layer 103 and the metal oxide layer is formed by oxidizing a portion of the electrically conductive (metal) layer. For example, the metal can be thermally oxidized in the presence of oxygen, electrolytically oxidized, chemically oxidized in an oxidizing liquid or gaseous medium or the like to form the metal oxide layer.

In some embodiments, a metal oxide layer precursor composition may be coated or printed over the electrically conductive layer 103 then treated to form metal oxide layer 105. Some non-limiting examples of metal oxide precursor compositions include sol-gels (metal alkoxides), metal carbonates, metal acetates (including organic acetates), metal hydroxides and metal oxide dispersions. The metal oxide precursor composition may be thermally treated to form the metal oxide layer. In some embodiments, room temperature may be sufficient temperature to thermally treat the precursor. In some embodiments, a metal oxide precursor composition is thermally treated by exposure to a temperature of at least 50° C., alternatively in a range of 50° C. to 150° C., alternatively in a range of 150° C. to 250° C., alternatively in a range of 250° C. to 350° C., alternatively in a range of 350° C. to 450° C., or any combination of these ranges. Thermal treatment time to form the metal oxide layer from the precursor depends on many factors, but may be in a range of about 0.1 min to about 1 min, alternatively about 1 min to about 5 mins, alternatively about 5 mins to about 10 mins, alternatively about 10 mins to about 30 minutes, alternatively about 30 mins to about 60 mins, alternatively about 60 mins to about 90 mins, alternatively in a range of about 90 mins to about 120 mins, or any combination of contiguous ranges thereof. In some embodiments, thermal treatment may be carried out using an oven, infrared heating elements, contact with a heated surface (e.g., a hot plate) or exposure to a flash lamp. In some embodiments, the metal oxide precursor composition is treated by exposure to reduced pressure to form the metal oxide, e.g., to drive off solvents or volatile reaction products. The reduced pressure may be less than 100 Torr, alternatively in a range of 0.1 to 100 Torr. Exposure time to the reduced pressure may be in a range of about 0.1 min to about 1 min, alternatively about 1 min to about 5 mins, alternatively about 5 mins to about 10 mins, alternatively about 10 mins to about 30 minutes, alternatively about 30 mins to about 60 mins, alternatively about 60 mins to about 90 mins, alternatively in a range of about 90 mins to about 120 mins, or any combination of contiguous ranges thereof. In some embodiments, both reduced pressure and thermal treatment may be used.

In some embodiments, the metal oxide layer precursor composition includes a metal, e.g., metal-containing particles, that is treated with an oxidant (e.g., as previously described) under conditions where the oxide layer precursor is readily oxidized but underlying electrically conductive layer is less so. The metal oxide precursor composition may include a metal that is the same as or different from the metal(s) of the electrically conductive layer. In some embodiments, multiple metal precursor compositions may be used to form a pattern of different metal oxides or multilayer structure of different metal oxides.

In some embodiments, the electrically conductive layer includes a mesh or sheet of electrically conductive carbon, including but not limited to, those formed from bundled carbon nanotubes or nanofibers. In some embodiments, such carbon-based electrically conductive layers may include a surface layer of a conductive metal, e.g., nickel, copper, zinc, titanium or the like. In some embodiments, the conductive metal surface layer may be applied by electrolytic or electroless plating methods. The metal surface layer may be partially or full oxidized to form the corresponding metal oxide layer. In some embodiments, a porous metal oxide may have a density lower than the density of a non-porous metal oxide. In some embodiments, the density of a porous metal oxide is in a range of 50% to 60% of the density of a non-porous metal oxide, alternatively 60% to 70%, alternatively 70% to 80%, alternatively 80% to 90%, alternatively 90% to 95%, alternatively 95% to 99%, or any combination of contiguous ranges thereof.

In some embodiments, the metal oxide is formed in the same chamber as, or in line with, a tool used to deposit the continuous porous lithium storage layer. Doped metal oxide layers can be formed by adding dopants or dopant precursors during the metal oxide formation step, or alternatively by adding dopants or dopant precursors to a surface of an electrically conductive layer prior to the metal oxide layer formation step, or alternatively treating a metal oxide layer with a dopant or dopant precursor after initial formation of the metal oxide layer. In some embodiments, the metal oxide layer itself may have some reversible or irreversible lithium storage capacity. In some embodiments, the reversible capacity of the metal oxide layer is lower than that of the continuous porous lithium storage layer. In some embodiments, the metal oxide layer may be porous.

In some embodiments, the metal oxide may be provided in a pattern over the electrically conductive layer as disclosed in U.S. patent application Ser. No. 16/909,008, the entire contents of which are incorporated herein for all purposes.

In some embodiments, the metal oxide is formed by oxidizing a surface region of a metal substrate, for example, oxidation of a metal foil such as nickel foil. The non-oxidized portion of the metal foil acts as the electrically conductive layer and the oxidized portion corresponds to the metal oxide layer. This method is amenable to high-volume and low-cost production of current collectors. The oxidation conditions depend upon the metal/metal surface, the target oxide thickness and the desired oxide porosity. Unless otherwise stated, any reference to a particular metal includes alloys of that metal. For example, nickel foil may include pure nickel or any alloy of nickel wherein nickel is the primary component. In some embodiments, an alloy metal also oxidizes, and the oxide of nickel formed from the alloy may include that corresponding oxidized metal. In some embodiments, the current collector is formed by oxidation of a nickel substrate, e.g., a nickel foil, in a furnace under air brought to a temperature of at least 300° C., alternatively at least 400° C., for example in a range of about 600° C. to about 900° C., or alternatively higher temperatures. The hold time depends upon the selected temperature and the desired thickness/porosity for the metal oxide layer. Typically, the oxidation hold time will be in a range of about 1 minute to about 2 hours, but shorter or longer times are contemplated. A surface pretreatment step may be applied to promote or otherwise control oxidation. Other metals such as copper and titanium may have other operational hold times, temperatures and pretreatments according to their propensity to be oxidized.

Figure 5:
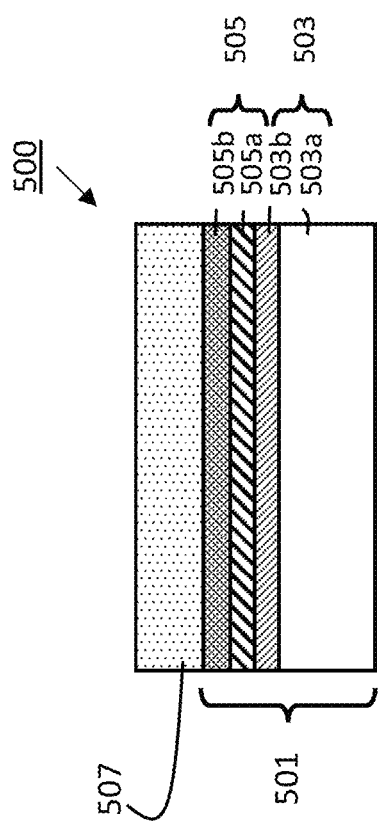
FIG. 5 is a cross-sectional view of an anode according to some embodiments of the present disclosure.

The current collector may have an electrically conductive layer that includes two or more sublayers differing in chemical composition. For example, the current collector may include metallic copper foil as a first electrically conductive sublayer, a second electrically conductive sublayer of metallic nickel provided over the copper, and a layer of a nickel oxide over the metallic nickel. As mentioned previously, the metallic copper and nickel may be in the form of alloys. Similarly, the metal oxide layer may include two or more sublayers differing in chemical composition. For example, the current collector may include a metallic copper foil, a layer of a copper oxide over the copper foil and a layer of titanium dioxide over the copper oxide. FIG. 5 is a cross sectional view that illustrates these embodiments. Anode 500 of FIG. 5 includes electrically conductive current collector 501 having metal oxide layer 505 provided over electrically conductive layer 503. Electrically conductive layer 503 is divided into first and second electrically conductive sublayers 503*a* and 503*b,* respectively, and metal oxide layer 505 is divided into first and second metal oxide sublayers 505*a* and 505*b,* respectively. Continuous porous lithium storage layer 507 is formed over second metal oxide sublayer 505*b.* Such sublayers may be discrete or take the form of a gradient in chemical composition. In some embodiments there may be a gradient or transition zone between the electrically conductive layer(s) and the metal oxide layer(s).

In some embodiments (not shown), an electrically conductive current collector may initially have an electrically conductive layer having metal sublayers such that a second metal sublayer at the surface is more easily oxidized than an underlying first metal sublayer. Under oxidation conditions to form the current collector, only the second sublayer oxidizes (all or just a portion). This may allow for better control of the thickness of the metal oxide layer.

Continuous Porous Lithium Storage Layer

The continuous porous lithium storage layer includes a porous material capable of reversibly incorporating lithium. In some embodiments, the continuous porous lithium storage layer includes silicon, germanium or a mixture of both. In some embodiments, the continuous porous lithium storage layer includes antimony or tin. In some embodiments, the continuous porous lithium storage layer is substantially amorphous. In some embodiments, the continuous porous lithium storage layer includes substantially amorphous silicon. Such substantially amorphous storage layers may include a small amount (e.g., less than 20 atomic %) of crystalline material dispersed therein. The continuous porous lithium storage layer may include dopants such as hydrogen, boron, phosphorous, sulfur, fluorine, aluminum, gallium, indium, arsenic, antimony, bismuth, nitrogen, or metallic elements. In some embodiments the continuous porous lithium storage layer may include porous substantially amorphous hydrogenated silicon (a-Si:H), having, e.g., a hydrogen content of from 0.1 to 20 atomic %, or alternatively higher. In some embodiments, the continuous porous lithium storage layer may include methylated amorphous silicon. Note that, unless referring specifically to hydrogen content, any atomic % metric used herein for a lithium storage material or layer refers to all atoms other than hydrogen.

In some embodiments, the continuous porous lithium storage layer includes at least 40 atomic % silicon, germanium or a combination thereof, alternatively at least 50 atomic %, alternatively at least 60 atomic %, alternatively at least 70 atomic %, alternatively, at least 80 atomic %, alternatively at least 90 atomic %. In some embodiments, the continuous porous lithium storage layer includes at least 40 atomic % silicon, alternatively at least 50 atomic %, alternatively at least 60 atomic %, alternatively at least 70 atomic %, alternatively, at least 80 atomic %, alternatively at least 90 atomic %, alternatively at least 95 atomic %, alternatively at least 97 atomic %.

In some embodiments, the continuous porous lithium storage layer includes less than 10 atomic % carbon, alternatively less than 5 atomic %, alternatively less than 2 atomic %, alternatively less than 1 atomic %, alternatively less than 0.5 atomic %. In some embodiments, the continuous porous lithium storage layer includes less than 5% by weight, alternatively less than 1% by weight, of carbon-based binders, carbon nanotubes, graphitic carbon, graphene, graphene oxide, reduced graphene oxide, carbon black, and conductive carbon.

The continuous porous lithium storage layer includes voids or interstices (pores), which may be random or non-uniform with respect to size, shape and distribution. Such porosity does not result in, or a result from, the formation of any recognizable nanostructures such as nanowires, nanopillars, nanotubes, nanochannels or the like. In some embodiments, the pores are polydisperse. In some embodiments, when analyzed by SEM cross section, 90% of pores larger than 100 nm in any dimension are smaller than about 5 µm in any dimension, alternatively smaller than about 3 µm, alternatively smaller than about 2 µm. In some embodiments, the continuous porous lithium storage layer may include some pores that are smaller than 100 nm in any dimension, alternatively smaller than 50 nm in any dimension, alternatively smaller than 20 nm in any dimension. In some embodiments the continuous porous lithium storage layer has an average density in a range of 1.0-1.1 g/cm$^3$, alternatively 1.1-1.2 g/cm$^3$, alternatively 1.2-1.3 g/cm$^3$, alternatively 1.3-1.4 g/cm$^3$, alternatively 1.4-1.5 g/cm$^3$, alternatively 1.5-1.6 g/cm$^3$, alternatively 1.6-1.7 g/cm$^3$, alternatively 1.7-1.8 g/cm$^3$, alternatively 1.8-1.9 g/cm$^3$, alternatively 1.9-2.0 g/cm$^3$, alternatively 2.0-2.1 g/cm$^3$, alternatively 2.1-2.2 g/cm$^3$, alternatively 2.2-2.25 g/cm$^3$, or any combination of contiguous ranges thereof, and includes at least 40 atomic % silicon, alternatively at least 50 atomic % silicon, alternatively at least 60 atomic % silicon, alternatively at least 70 atomic % silicon, alternatively 80 atomic % silicon, alternatively at least 90 atomic % silicon, alternatively at least 95 atomic % silicon.

In some embodiments, the majority of active material (e.g., silicon, germanium or alloys thereof) of the continuous porous lithium storage layer has substantial lateral connectivity across portions of the current collector creating, such connectivity extending around random pores and interstices (as discussed later). Referring again to FIG. 1, in some embodiments, "substantial lateral connectivity" means that active material at one point X in the continuous porous lithium storage layer 107 may be connected to active material at a second point X' in the layer at a straight-line lateral distance LD that is at least as great as the thickness T of the continuous porous lithium storage layer, alternatively, a lateral distance at least 2 times as great as the thickness, alternatively, a lateral distance at least 3 times as great as the thickness. Not shown, the total path distance of material connectivity, including circumventing pores, may be longer than LD. In some embodiments, the continuous porous lithium storage layer may be described as a matrix of interconnected silicon, germanium or alloys thereof, with random pores and interstices embedded therein. In some embodiments, the continuous porous lithium storage layer has a sponge-like form. In some embodiments, about 75% or more of the metal oxide layer surface is contiguous with the continuous porous lithium storage layer, at least prior to electrochemical formation. It should be noted that the continuous porous lithium storage layer does not necessarily extend across the entire anode without any lateral breaks and may include random discontinuities or cracks and still be considered continuous.

In some embodiments, the continuous porous lithium storage layer includes a substoichiometric oxide of silicon (SiO$_x$), germanium (GeO$_x$) or tin (SnO$_x$) wherein the ratio of oxygen atoms to silicon, germanium or tin atoms is less than 2:1, i.e., x<2, alternatively less than 1:1, i.e., x<1. In some embodiments, x is in a range of 0.02 to 0.95, alternatively 0.02 to 0.10, alternatively 0.10 to 0.50, or alternatively 0.50 to 0.95, alternatively 0.95 to 1.25, alternatively 1.25 to 1.50, or any combination of contiguous ranges thereof.

In some embodiments, the continuous porous lithium storage layer includes a substoichiometric nitride of silicon (SiN$_y$), germanium (GeN$_y$) or tin (SnN$_y$) wherein the ratio of nitrogen atoms to silicon, germanium or tin atoms is less than 1.25:1, i.e., y<1.25. In some embodiments, y is in a range of 0.02 to 0.95, alternatively 0.02 to 0.10, alternatively 0.10 to 0.50, or alternatively 0.50 to 0.95, alternatively 0.95 to 1.20, or any combination of contiguous ranges thereof.

In some embodiments, the continuous porous lithium storage layer includes a substoichiometric oxynitride of silicon (SiO$_x$N$_y$), germanium (GeO$_x$N$_y$), or tin (SnO$_x$N$_y$) wherein the ratio of total oxygen and nitrogen atoms to silicon, germanium or tin atoms is less than 1:1, i.e., (x+y)<1. In some embodiments, (x+y) is in a range of 0.02 to 0.95, alternatively 0.02 to 0.10, alternatively 0.10 to 0.50, or alternatively 0.50 to 0.95, or any combination of contiguous ranges thereof.

In some embodiments, the above sub-stoichiometric oxides, nitrides or oxynitrides are provided by a CVD process, including but not limited to, a PECVD process. The oxygen and nitrogen may be provided uniformly within the continuous porous lithium storage layer, or alternatively the oxygen or nitrogen content may be varied as a function of storage layer thickness.

Figure 6:
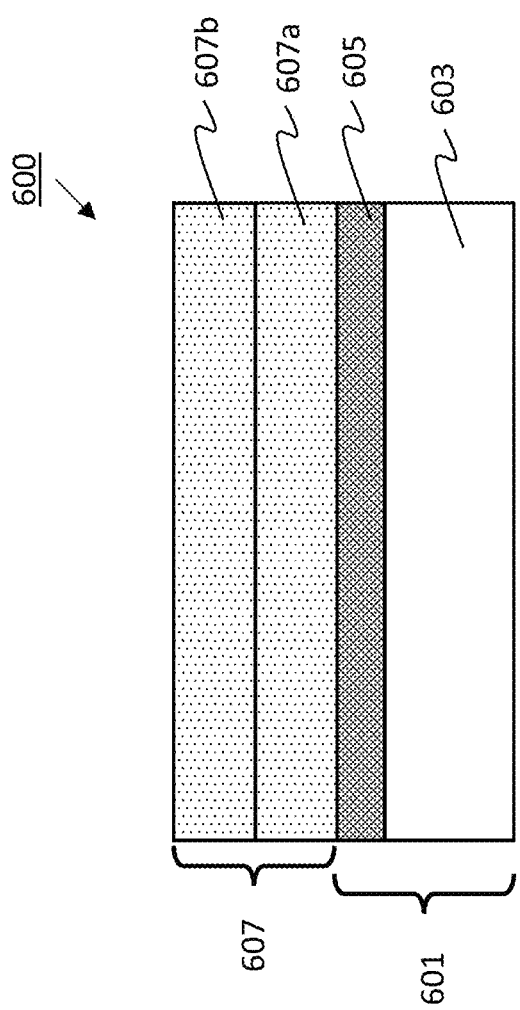
FIG. 6 is a cross-sectional view of an anode according to some embodiments of the present disclosure.

Referring to FIG. 6, anode 600 includes continuous porous lithium storage layer 607 provided over current collector 601 including metal oxide layer 605 and electrically conductive layer 603. In some embodiments, continuous porous lithium storage layer 607 includes a plurality of continuous porous lithium storage sublayers (607a and 607b) having different physical properties or chemical compositions, and independently selected from any of the embodiments discussed above. For example, lithium storage sublayer 607a may include amorphous silicon with low oxygen content and lithium storage sublayer 607b may include a suboxide of silicon, SiO$_x$, with x in a range of 0.02 to 0.95. Alternatively, the compositions of 607a and 607b could be reversed. In another example, lithium storage sublayer 607a may include amorphous silicon with low germanium and lithium storage sublayer 607b includes a higher atomic % germanium than 607a. In some embodiments, the lithium storage sublayers may have different amounts or types of dopants. In some other embodiments, lithium storage sublayers 607a and 607b have similar chemical compositions, but the density of 607a is higher than 607b. These are just a few non-limiting examples. Many other combinations are possible. Although two lithium storage sublayers are shown in FIG. 6, three or more sublayers may instead be used.

In some embodiments, the continuous porous lithium storage layer includes a gradient of components, density, or porosity, or a combination thereof, as a function of layer thickness. For example, the continuous porous lithium storage layer 107 may include amorphous silicon having a density higher near the metal oxide layer 105 than near the top surface 108, or vice versa.

Additional Lithium Storage Layers

The generally planar nature of some embodiments of the present anode further allows simple coating of additional lithium storage layers that are not continuous porous lithium storage layers as described herein. For example, conventional lithium-ion battery slurries based on carbon that may optionally further include silicon particles, may be coated over the continuous porous lithium storage layer of the present disclosure to further enhance charge capacity. Coating methods may include curtain coating, slot coating, spin coating, ink jet coating, spray coating or any other suitable method.

CVD

CVD generally involves flowing a precursor gas, a gasified liquid in terms of direct liquid injection CVD or gases and liquids into a chamber containing one or more objects, typically heated, to be coated. Chemical reactions occur on and near the hot surfaces, resulting in the deposition of a thin film on the surface. This is accompanied by the production of chemical by-products that are exhausted out of the chamber along with unreacted precursor gases. As would be expected with the large variety of materials deposited and the wide range of applications, there are many variants of CVD that may be used to form the lithium storage layer, the metal oxide layer, a supplemental layer (see below) or other layer. It may be done in hot-wall reactors or cold-wall reactors, at sub-torr total pressures to above-atmospheric pressures, with and without carrier gases, and at temperatures typically ranging from 100-1600° C. in some embodiments. There are also a variety of enhanced CVD processes, which involve the use of plasmas, ions, photons, lasers, hot filaments, or combustion reactions to increase deposition rates and/or lower deposition temperatures. Various process conditions may be used to control the deposition, including but not limited to, temperature, precursor material, gas flow rate, pressure, substrate voltage bias (if applicable), and plasma energy (if applicable).

As mentioned, the continuous porous lithium storage layer, e.g., a layer of silicon or germanium or both, may be provided by plasma-enhanced chemical vapor deposition (PECVD). Relative to conventional CVD, deposition by PECVD can often be done at lower temperatures and higher rates, which can be advantageous for higher manufacturing throughput. In some embodiments, the PECVD is used to deposit a substantially amorphous silicon layer (optionally doped) over the metal oxide layer. In some embodiments, PECVD is used to deposit a substantially amorphous continuous porous silicon layer over the metal oxide layer.

PECVD

In PECVD processes, according to various implementations, a plasma may be generated in a chamber in which the substrate is disposed or upstream of the chamber and fed into the chamber. Various types of plasmas may be used including, but not limited to, capacitively-coupled plasmas, inductively-coupled plasmas, and conductive coupled plasmas. Any appropriate plasma source may be used, including DC, AC, RF, VHF, combinatorial PECVD and microwave sources may be used. Some non-limiting examples of useful PECVD tools include hollow cathode tube PECVD, magnetron confined PECVD, inductively coupled plasma chemical vapor deposition (ICP-PECVD, sometimes called HDPECVD, ICP-CVD or HDCVD), and expanding thermal plasma chemical vapor deposition (ETP-PECVD).

PECVD process conditions (temperatures, pressures, precursor gases, carrier gasses, dopant gases, flow rates, energies, and the like) can vary according to the particular process and tool used, as is well known in the art In some implementations, the PECVD process is an expanding thermal plasma chemical vapor deposition (ETP-PECVD) process. In such a process, a plasma generating gas is passed through a direct current arc plasma generator to form a plasma, with a web or other substrate including the current collector optionally in an adjoining vacuum chamber. A silicon source gas is injected into the plasma, with radicals generated. The plasma is expanded via a diverging nozzle and injected into the vacuum chamber and toward the substrate. An example of a plasma generating gas is argon (Ar). In some embodiments, the ionized argon species in the plasma collide with silicon source molecules to form radical species of the silicon source, resulting in deposition onto the current collector. Example ranges for voltages and currents for the DC plasma source are 60 to 80 volts and 40 to 70 amperes, respectively.

Any appropriate silicon source may be used to deposit silicon, including silane ($SiH_4$), dichlorosilane ($H_2SiCl_2$), monochlorosilane ($H_3SiCl$), trichlorosilane ($HSiCl_3$), silicon tetrachloride (SiCl4), and diethylsilane. Depending on the gas(es) used, the silicon layer may be formed by decomposition or reaction with another compound, such as by hydrogen reduction. In some embodiments, the gases may include a silicon source such as silane, a noble gas such as helium, argon, neon, or xenon, optionally one or more dopant gases, and substantially no hydrogen. In some embodiments, the gases may include argon, silane, and hydrogen, and optionally some dopant gases. In some embodiments the gas flow ratio of argon relative to the combined gas flows for silane and hydrogen is at least 3.0, alternatively at least 4.0. In some embodiments, the gas flow ratio of argon relative to the combined gas flows for silane and hydrogen is in a range of 3-5, alternatively 5-10, alternatively 10-15, alternatively 15-20, or any combination of contiguous ranges thereof. In some embodiments, the gas flow ratio of hydrogen gas to silane gas is in a range of 0-0.1, alternatively 0.1-0.2, alternatively 0.2-0.5, alternatively 0.5-1, alternatively 1-2, alternatively 2-5, or any combination of contiguous ranges thereof. In some embodiments, higher porosity silicon may be formed and/or the rate of silicon deposition may be increased when the gas flow ratio of silane relative to the combined gas flows of silane and hydrogen increases. In some embodiments a dopant gas is borane or phosphine, which may be optionally mixed with a carrier gas. In some embodiments, the gas flow ratio of dopant gas (e.g., borane or phosphine) to silicon source gas (e.g., silane) is in a range of 0.0001-0.0002, alternatively 0.0002-0.0005, alternatively 0.0005-0.001, alternatively 0.001-0.002, alternatively 0.002-0.005, alternatively 0.005-0.01, alternatively 0.01-0.02, alternatively 0.02-0.05, alternatively 0.05-0.10, or any combination of contiguous ranges thereof. Such gas flow ratios described above may refer to the relative gas flow, e.g., in standard cubic centimeter per minute (SCCM). In some embodiments, the PECVD deposition conditions and gases may be changed over the course of the deposition.

In some embodiments, the temperature at the current collector during at least a portion of the time of PECVD deposition is in a range of 100° C. to 200° C., alternatively 200° C. to 300° C., alternatively 300° C. to 400° C., alternatively 400° C. to 500° C., alternatively 500° C. to 600° C., or any combination of contiguous ranges thereof. In some embodiments, the temperature may vary during the time of PECVD deposition. For example, the temperature during early times of the PECVD may be higher than at later times. Alternatively, the temperature during later times of the PECVD may be higher than at earlier times.

The thickness or mass per unit area of the continuous porous lithium storage layer depends on the storage material, desired charge capacity and other operational and lifetime considerations. Increasing the thickness typically provides more capacity. If the continuous porous lithium storage layer becomes too thick, electrical resistance may increase and the stability may decrease. In some embodiments, the anode may be characterized as having an active silicon areal density of at least 0.5 $mg/cm^2$, alternatively at least 1.0 $mg/cm^2$, alternatively at least 1.5 $mg/cm^2$, alternatively at least 3 $mg/cm^2$, alternatively at least 5 $mg/cm^2$. In some embodiments, the lithium storage structure may be characterized as having an active silicon areal density in a range of 0.5-1.5 $mg/cm^2$, alternatively 1.5-2 $mg/cm^2$, alternatively in a range of 2-3 $mg/cm^2$, alternatively in a range of 3-5 $mg/cm^2$, alternatively in a range of 5-10 $mg/cm^2$, alternatively in a range of 10-15 mg/cm², alternatively in a range of 15-20 mg/cm², or any combination of contiguous ranges thereof. "Active areal silicon density" refers to the silicon in electrical communication with the current collector that is available for reversible lithium storage at the beginning of cell cycling, e.g., after anode "electrochemical formation" discussed later. "Areal" of this term refers to the surface area of the electrically conductive layer over which active silicon is provided. In some embodiments, not all of the silicon content is active silicon, i.e., some may be tied up in the form of non-active silicides or electrically isolated from the current collector.

In some embodiments the continuous porous lithium storage has an average thickness of at least 0.5 μm, alternatively ate least 1 μm, alternatively at least 3 μm, alternatively at least 7 μm. In some embodiments, the continuous porous lithium storage layer has an average thickness in a range of about 0.5 μm to about 50 μm. In some embodiments, the continuous porous lithium storage layer comprises at least 85 atomic % amorphous silicon and has a thickness in a range of 0.5 to 1 μm, alternatively 1-2 μm, alternatively 2-4 μm, alternatively 4-7 μm, alternatively 7-10 μm, alternatively 10-15 μm, alternatively 15-20 μm, alternatively 20-25 μm, alternatively 25-30 μm, alternatively 30-40 μm, alternatively 40-50 μm, or any combination of contiguous ranges thereof.

In some embodiments, the continuous porous lithium storage layer includes silicon but does not contain a substantial amount of crystalline silicides, i.e., the presence of silicides is not readily detected by X-Ray Diffraction (XRD). Metal silicides, e.g., nickel silicide, commonly form when silicon is deposited at higher temperatures directly onto metal, e.g., nickel foil. Metal silicides such as nickel silicides often have much lower lithium storage capacity than silicon itself. In some embodiments, the average atomic % of silicide-forming metallic elements within the continuous porous lithium storage layer are on average less than 35%, alternatively less than 20%, alternatively less than 10%, alternatively less than 5%. In some embodiments, the average atomic % of silicide-forming metallic elements within the continuous porous lithium storage layer are in a range of about 0.01% to about 10%, alternatively about 0.05 to about 5%. In some embodiments, the atomic % of silicide forming metallic elements in the continuous porous lithium storage layer is higher nearer the current collector than away from the current collector.

Other Anode Features

Figure 7A:
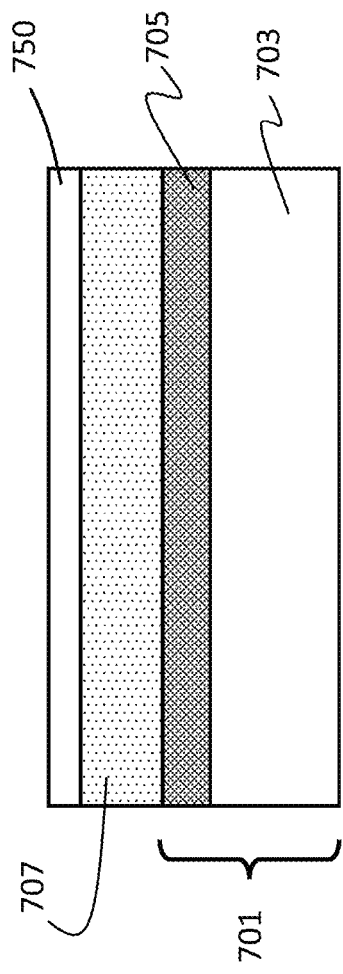
FIG. 7A is a cross-sectional view of an anode according to some embodiments of the present disclosure.

In some embodiments, the anode may further include one or more supplemental layers. As shown in FIG. 7A, a supplemental layer 750 is provided over the surface of the continuous porous lithium storage layer 707, which overlays current collector 701 including metal oxide layer 705 and electrically conductive layer 703. In some embodiments, the supplemental layer is a protection layer to enhance lifetime or physical durability. The supplemental layer may be an oxide or nitride formed from the lithium storage material itself, e.g., silicon dioxide, silicon nitride, or silicon oxynitride in the case of silicon. A supplemental layer may be deposited, for example, by ALD, CVD, PECVD, evaporation, sputtering, solution coating, ink jet or any method that is compatible with the anode. In some embodiments, a supplemental layer is deposited in the same CVD or PECVD device as the continuous lithium storage layer. For example, stoichiometric silicon dioxide or silicon nitride supplemental layer by be formed by introducing an oxygen- or nitrogen-containing gas (or both) along with the silicon precursor gas used to form the continuous porous lithium storage layer.

In some embodiments the supplemental layer may include boron nitride or silicon carbide. In some embodiments, supplemental layer 750 may include a metal compound as described below.

Figure 7B:
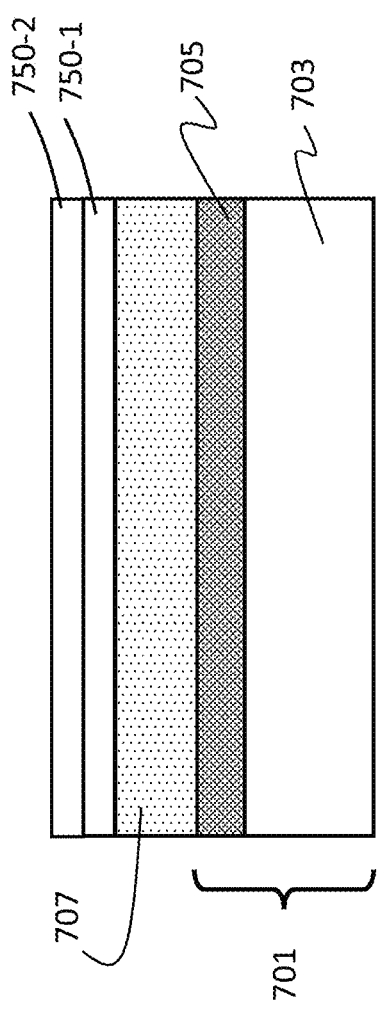
FIG. 7B is a cross-sectional view of an anode according to some embodiments of the present disclosure.

As shown in FIG. 7B, in some embodiments, the anode includes a first supplemental layer 750-1 and a second supplemental layer 750-2 overlaying the first supplemental layer and having a chemical composition different than the first supplemental layer. In some embodiments, the first supplemental layer 750-1 may include silicon nitride, silicon dioxide, silicon oxynitride, or a first metal compound. The second supplemental layer 750-2 has a composition different from the first supplemental layer and may include silicon nitride, silicon dioxide, silicon oxynitride, or a second metal compound. In some embodiments, the second supplemental layer may be in contact with the first supplemental layer. In some embodiments, one or more additional supplemental layers may be provided over the second supplemental layer. In some embodiments having two or more supplemental layers, each supplemental layer is in contact with at least one other supplemental layer.

In some embodiments, the first supplemental layer 750-1 and the optional second or additional supplemental layers may help stabilize the continuous porous lithium storage layer by providing a barrier to direct electrochemical reactions with solvents or electrolytes that can degrade the interface. A supplemental layer should be reasonably conductive to lithium ions and permit lithium ions to move into and out of the continuous porous lithium storage layer during charging and discharging. In some embodiments, the lithium ion conductivity of a supplemental layer is at least $10^{-9}$ S/cm, alternatively at least $10^{-8}$ S/cm, alternatively at least $10^{-7}$ S/cm, alternatively at least $10^{-6}$ S/cm. In some embodiments, the supplemental layer acts as a solid-state electrolyte. In some embodiments, the supplemental layer(s) are less electrically conductive than the lithium storage structure so that little or no electrochemical reduction of lithium ions to lithium metal occurs at the supplemental layer/electrolyte interface. In addition to providing protection from electrochemical reactions, the multiple supplemental layer structure embodiments may provide superior structural support. In some embodiments, although the supplemental layers may flex and may form fissures when the continuous porous lithium storage layer expands during lithiation, crack propagation can be distributed between the layers to reduce direct exposure of the lithium storage structure to the bulk electrolyte. For example, a fissure in the second supplemental layer may not align with a fissure in the first supplemental layer. Such an advantage may not occur if just one thick supplemental layer is used. In an embodiment, the second supplemental layer may be formed of a material having higher flexibility than the first supplemental layer.

In some embodiments, a supplemental layer (the first supplemental layer, the second supplemental layer, or any additional supplemental layer(s)) may include silicon nitride, e.g., substantially stoichiometric silicon nitride where the ratio of nitrogen to silicon is in a range of 1.33 to 1.25. A supplemental layer comprising silicon nitride may have an average thickness in a range of about 0.5 nm to 1 nm, alternatively 1 nm to 2 nm, alternatively 2 nm to 10 nm, alternatively 10 nm to 20 nm, alternatively 20 nm to 30 nm, alternatively 30 nm to 40 nm, alternatively 40 nm to 50 nm, or any combination of contiguous ranges thereof. Silicon nitride may be deposited by an atomic layer deposition (ALD) process or by a CVD process. In some embodiments, the continuous porous lithium storage layer includes silicon deposited by some type of CVD process as described above, and at the end, a nitrogen gas source is added to the CVD deposition chamber along with the silicon source.

In some embodiments, a supplemental layer (the first supplemental layer, the second supplemental layer, or any additional supplemental layer(s)) may include silicon dioxide, e.g., substantially stoichiometric silicon dioxide where the ratio of oxygen to silicon is in a range of 2.0 to 1.9. A supplemental layer comprising silicon dioxide may have an average thickness in a range of about 2 nm to 10 nm, alternatively 10 nm to 30 nm, alternatively 30 nm to 50 nm, alternatively 50 nm to 70 nm, alternatively 70 nm to 100 nm, alternatively 100 nm to 150 nm, alternatively 150 nm to 200 nm, or any combination of contiguous ranges thereof. Silicon dioxide may be deposited by an atomic layer deposition (ALD) process or by a CVD process. In some embodiments, the continuous porous lithium storage layer includes silicon deposited by some type of CVD process as described above, and at the end, an oxygen-containing gas source is added to the CVD deposition chamber along with the silicon source.

In some embodiments, a supplemental layer (the first supplemental layer, the second supplemental layer, or any additional supplemental layer(s)) may include silicon oxynitride, e.g., a substantially stoichiometric oxynitride of silicon ($SiO_xN_y$) wherein the sum of 0.5x and 0.75y is in a range of 1.00 to 0.95. A supplemental layer comprising silicon nitride may have an average thickness in a range of about 0.5 nm to 1 nm, alternatively 1 nm to 2 nm, alternatively 2 nm to 10 nm, alternatively 10 nm to 20 nm, alternatively 20 nm to 30 nm, alternatively 30 nm to 40 nm, alternatively 40 nm to 50 nm, alternatively 50 nm to 70 nm, alternatively 70 nm to 100 nm, alternatively 100 nm to 150 nm, or any combination of contiguous ranges thereof. In some embodiments, silicon oxynitride may be provided by a CVD process, including but not limited to, a PECVD process. The oxygen and nitrogen may be provided uniformly within the continuous porous lithium storage layer, or alternatively the oxygen or nitrogen content may be varied as a function of position (e.g., height) within the storage layer.

In some embodiments, silicon nitride, silicon dioxide, or silicon oxynitride may be deposited by an atomic layer deposition (ALD) process or by a CVD process. In some embodiments, the continuous porous lithium storage layer includes silicon deposited by some type of CVD process as described above, and at the end, a nitrogen- and/or an oxygen-containing gas source is added to the CVD deposition chamber along with the silicon source.

In some embodiments a supplemental layer (the first supplemental layer, the second supplemental layer, or any additional supplemental layer(s)) may include a metal oxide, metal nitride, or metal oxynitride, e.g., those containing aluminum, titanium, vanadium, zirconium, or tin, or mixtures thereof. In some embodiments, a supplemental layer including a metal oxide, metal nitride, or metal oxynitride, may have an average thickness of less than about 100 nm, for example, in a range of about 0.5 nm to about 1 nm, alternatively about 1 nm to about 2 nm, alternatively 2 nm to 10 nm, alternatively 10 nm to 20 nm, alternatively 20 nm to 30 nm, alternatively 30 nm to 40 nm, alternatively 40 nm to 50 nm, or any combination of contiguous ranges thereof. The metal oxide, metal nitride, or metal oxynitride may include other components or dopants such as transition metals, phosphorous or silicon.

In some embodiments, the metal compound may include a lithium-containing material such as lithium phosphorous oxynitride (LIPON), a lithium phosphate, a lithium aluminum oxide, or a lithium lanthanum titanate. In some embodiments, the thickness of supplemental layer including a lithium-containing material may be in a range of 0.5 nm to 200 nm, alternatively 1 nm to 10 nm, alternatively 10 nm to 20 nm, alternatively 20 nm to 30 nm, alternatively 30 nm to 40 nm, alternatively 40 nm to 50 nm, alternatively 50 nm to 100 nm, alternatively 100 to 200 nm, or any combination of contiguous ranges thereof.

In some embodiments the metal compound may be deposited by a process comprising ALD, thermal evaporation, sputtering, or e-beam evaporation. ALD is a thin-film deposition technique typically based on the sequential use of a gas phase chemical process. The majority of ALD reactions use at least two chemicals, typically referred to as precursors. These precursors react with the surface of a material one at a time in a sequential, self-limiting, manner. Through the repeated exposure to separate precursors, a thin film is deposited, often in a conformal manner. In addition to conventional ALD systems, so-called spatial ALD (SALD) methods and materials can be used, e.g., as described U.S. Pat. No. 7,413,982, the entire contents of which are incorporated by reference herein for all purposes. In certain embodiments, SALD can be performed under ambient conditions and pressures and have higher throughput than conventional ALD systems.

In some embodiments, the process for depositing the metal compound may include electroless deposition, contact with a solution, contact with a reactive gas, or electrochemical methods. In some embodiments, a metal compound may be formed by depositing a metallic layer (including but not limited to thermal evaporation, CVD, sputtering, e-beam evaporation, electrochemical deposition, or electroless deposition) followed by treatment to convert the metal to the metal compound (including but not limited to, contact with a reactive solution, contact with an oxidizing agent, contact with a reactive gas, or a thermal treatment).

The supplemental layer may include an inorganic-organic hybrid structure having alternating layers of metal oxide and bridging organic materials. These inorganic-organic hybrid structures are sometimes referred to as "metalcone". Such structures can be made using a combination of atomic layer deposition to apply the metal compound and molecular layer deposition (MLD) to apply the organic. The organic bridge is typically a molecule having multiple functional groups. One group can react with a layer comprising a metal compound and the other group is available to react in a subsequent ALD step to bind a new metal. There is a wide range of reactive organic functional groups that can be used including, but not limited to hydroxy, carboxylic acid, amines, acid chlorides and anhydrides. Almost any metal compound suitable for ALD deposition can be used. Some non-limiting examples include ALD compounds for aluminum (e.g., trimethyl aluminum), titanium (e.g., titanium tetrachloride), zinc (e.g., diethyl zinc), and zirconium (tris (dimethylamino)cyclopentadienyl zirconium). For the purposes of the present disclosure, this alternating sublayer structure of metal oxide/bridging organic is considered a single supplemental layer of metalcone. When the metal compound includes aluminum, such structures may be referred to as an alucone. Similarly, when the metal compound includes zirconium, such structures may be referred to as a zircone. Further examples of inorganic-organic hybrid structures that may be suitable as a supplemental layer may be found in U.S. Pat. No. 9,376,455, and US patent publications 2019/0044151 and 2015/0072119, the entire contents of which are incorporated herein by reference.

In some embodiments, a supplemental layer having a metalcone may have a thickness in a range of 0.5 nm to 200 nm, alternatively 1 nm to 10 nm, alternatively 10 nm to 20 nm, alternatively 20 nm to 30 nm, alternatively 30 nm to 40 nm, alternatively 40 nm to 50 nm, alternatively 50 nm to 100 nm, alternatively 100 to 200 nm, or any combination of contiguous ranges thereof.

In some embodiments a supplemental layer (a first, a second, or an additional supplemental layer) may include boron nitride or silicon carbide and may have an average thickness of less than about 100 nm, for example, in a range of about 0.5 nm to about 1 nm, alternatively about 1 nm to about 2 nm, alternatively 2 nm to 10 nm, alternatively 10 nm to 20 nm, alternatively 20 nm to 30 nm, alternatively 30 nm to 40 nm, alternatively 40 nm to 50 nm, or any combination of contiguous ranges thereof.

In some embodiments the anode is at least partially pre-lithiated, i.e., the continuous porous lithium storage layer and/or the metal oxide layer includes some lithium prior to battery assembly, that is, prior to combining the anode with a cathode in a battery cell.

In some embodiments, lithium metal (or some other lithiation material) is deposited onto the metal oxide layer prior to depositing the continuous porous lithium storage layer. The lithium may be deposited, for example, by evaporation, e-beam or sputtering. Some of the lithium may form lithium oxide. In embodiments where the metal oxide layer includes an oxide of a transition metal, e.g., copper or nickel, a mixed metal oxide may form. In some embodiments, deposition of a lithium layer over the metal oxide may lessen first cycle losses in lithium during electrochemical formation (discussed below) of the anode.

In some embodiments, the ratio of deposited lithium metal atoms to oxygen atoms in the metal oxide layer is at least 0.02, alternatively in range from 0.05 to 1.0. In some cases, the amount of deposited lithium metal corresponds to at least 1% of the maximum lithium areal capacity of the continuous porous lithium storage layer, alternatively in a range of 2% to 10%, alternatively 10% to 30%, alternatively 30% to 50% or any combination of these ranges.

In some embodiments, the continuous porous lithium storage layer may be at least partially prelithiated prior to a first electrochemical cycle after battery assembly, or alternatively prior to battery assembly. That is, some lithium may be incorporated into the continuous porous lithium storage layer to form a lithiated storage layer even prior to a first battery cycle. In some embodiments, the lithiated storage layer may break into smaller structures, including but not limited to platelets, that remain electrochemically active and continue to reversibly store lithium. Note that "lithiated storage layer" simply means that at least some of the potential storage capacity of the lithium storage layer is filled, but not necessarily all. In some embodiments, the lithiated storage layer may include lithium in a range of 1% to 10% of the theoretical lithium storage capacity of the continuous porous lithium storage layer, alternatively 10% to 20%, alternatively, 20% to 30%, alternatively 30% to 40%, alternatively 40% to 50%, alternatively 50% to 60%, alternatively 60% to 70%, alternatively 70% to 80%, alternatively 80% to 90%, alternatively 90% to 100%, or any combination of contiguous ranges thereof. In some embodiments, the metal oxide layer may capture some of the lithium, and one may need to account for such capture to achieve the desired lithium range in the lithiated storage layer.

In some embodiments prelithiation may include depositing lithium metal over the continuous porous lithium storage layer, alternatively between one or more lithium storage sublayers, or both, e.g., by evaporation, e-beam or sputtering. Alternatively, prelithiation may include contacting the anode with a reductive lithium organic compound, e.g., lithium naphthalene, n-butyllithium or the like. In some embodiments, prelithiation may include incorporating lithium by electrochemical reduction of lithium ion in pre-lithiation solution.

In some embodiments, one or more supplemental layers (described above) may be formed on the continuous porous lithium storage layer prior to prelithiation. The supplemental layer(s) may be used to control the rate of lithium incorporation. Non-limiting examples of the supplemental layer materials include silicon nitride, a metal oxide, a metal nitride, or a metal oxynitride.

In some embodiments, prelithiation includes physical contact of the continuous porous lithium storage layer with a lithiation material. The lithiation material may include a reducing lithium compound, lithium metal or a stabilized lithium metal powder, any of which may optionally be provided as a coating on a lithium transfer substrate. The lithium transfer substrate may include a metal (e.g., as a foil), a polymer, a ceramic, or some combination of such materials, optionally in a multilayer format. In some embodiments, such lithiation material may be provided on at least one side of a current separator that faces the anode, i.e., the current separator also acts as a lithium transfer substrate. Stabilized lithium metal powders ("SLMP") typically have a phosphate, carbonate or other coating over the lithium metal particles, e.g. as described in U.S. Pat. Nos. 8,377,236, 6,911,280, 5,567,474, 5,776,369, and 5,976,403, the entire contents of which are incorporated herein by reference. In some embodiments SLMPs may require physical pressure to break the coating and allow incorporation of the lithium into the continuous porous lithium storage layer. In some embodiments, other lithiation materials may be applied with pressure and/or heat to promote lithium transfer into the continuous lithium storage layer, optionally through one or more supplemental layers. In some embodiments a pressure applied between an anode and a lithiation material may be at least 200 kPa, alternatively at least 1000 kPa, alternatively at least 5000 kPa. Pressure may be applied, for example, by calendering, pressurized plates, or in the case of a lithiation material coating on a current separator, by assembly into battery having confinement or other pressurizing features.

In some embodiments, prelithiation includes thermally treating the continuous porous lithium storage layer during lithium incorporation, after lithium incorporation, or both during and after. The thermal treatment may assist in the incorporation of the lithium into the continuous porous lithium storage layer, for example by promoting lithium diffusion. In some embodiments, thermally treating includes exposing the anode to a temperature in a range of 50° C. to 100° C., alternatively 100° C. to 150° C., alternatively 150° C. to 200° C., alternatively 200° C. to 250° C., alternatively 250° C. to 300° C., or alternatively 300° C. to 350° C. In some embodiments, thermal treatment may be done under controlled atmosphere, e.g., under vacuum or argon atmosphere to avoid unwanted reactions with oxygen, nitrogen, water or other reactive gases.

In some embodiments, prelithiation may soften the continuous porous lithium storage layer, for example, due to the formation of a lithium-silicon alloy. This softening may cause problems in some processes, for example, roll-to-roll processes whereby the softened lithium storage layer begins to stick to rollers or to itself during winding. In some embodiments providing at one or more supplemental layers prior to prelithiation or after prelithiation, the structural integrity and processability of the anode may be substantially improved. In some embodiments, the supplemental layer(s) may act as a harder interface with other surfaces to prevent or reduce contact of such surfaces with the softened lithium storage material.

In some embodiments, lithium metal may be deposited over the continuous porous lithium storage layer followed by deposition of lithium ion-conducting layer. The anode may be thermally treated prior to deposition of the lithium ion-conducting layer, after deposition of the lithium ion-conducting layer, or both. In some embodiments, the lithium metal is deposited directly onto the continuous porous lithium storage layer. In some embodiments, a supplemental layer, e.g., silicon nitride, is deposited onto the continuous porous lithium storage layer prior to deposition of the lithium metal. In some embodiments, the lithium ion-conducting layer may include a lithium-containing material, a metal oxide, or a metalcone. Some non-limiting examples of lithium ion-conducting layer materials include a lithium phosphorous oxynitride (LIPON), a lithium phosphate, a lithium aluminum oxide, a lithium lanthanum titanate, and alucones. The lithium ion-conducting layer may include multiple sublayers of different materials, e.g., selected from the above list.

In some embodiments, the anode may be treated with a reducing agent prior to final battery assembly. The reducing agent may have an electrochemical potential sufficient to reduce at least a portion of the metal oxide layer. The reducing agent may include an inorganic hydride, a substituted or unsubstituted borohydride, an amine-borane, or an anionic organic aromatic compound. In some embodiments, the reducing agent may be provided in a non-aqueous solvent that is itself not reduced by the reducing agent and applied under controlled conditions having low oxygen and moisture.

Thermal treatments were discussed above with respect to pre-lithiation and metal oxide precursors, but in some embodiments the anode may be thermally treated prior to battery assembly (after deposition of the continuous porous lithium storage layer is complete, but before the anode is combined with a cathode in a battery cell), with or without a pre-lithiation step. In some embodiments, thermally treating the anode may improve adhesion of the various layers or electrical conductivity, e.g., by inducing migration of metal from the current collector (i.e., the metal oxide layer or the underlying electrically conductive metal layer) or atoms from the optional supplemental layer into the continuous porous lithium storage layer. In some embodiments, thermally treating the anode may be done in a controlled environment, e.g., under vacuum, argon, or nitrogen having a low oxygen and water content (e.g., less than 100 ppm or partial pressure of less than 10 Torr, alternatively less than 1 Torr, alternatively less than 0.1 Torr to prevent degradation). Herein, "under vacuum" generally refers to a reduced pressure condition wherein the total pressure of all gasses (e.g. in a vacuum oven) is less than 10 Torr. Due to equipment limitations, the vacuum pressure is typically greater than about $10^{-8}$ Torr. In some embodiments, anode thermal treatment may be carried out using an oven, a tube furnace, infrared heating elements, contact with a hot surface (e.g. a hot plate), or exposure to a flash lamp. The anode thermal treatment temperature and time depend on the materials of the anode. In some embodiments, anode thermal treatment includes heating the anode to a temperature of at least 50° C., optionally in a range of 50° C. to 600° C., alternatively 100° C. to 250° C., alternatively 250° C. to 350° C., alternatively 350° C. to 450° C., alternatively 450° C. to 600° C., alternatively 600° C. to 700° C., alternatively 700° C. to 800° C., or any combination of contiguous ranges thereof. In some embodiments, the anode thermal treatment time may be in a range of about 0.1 min to about 1 min, alternatively about 1 min to about 5 mins, alternatively about 5 mins to about 10 mins, alternatively about 10 mins to about 30 minutes, alternatively about 30 mins to about 60 mins, alternatively about 60 mins to about 90 mins, alternatively in a range of about 90 mins to about 120 mins, or any combination of contiguous ranges thereof.

Figure 8:
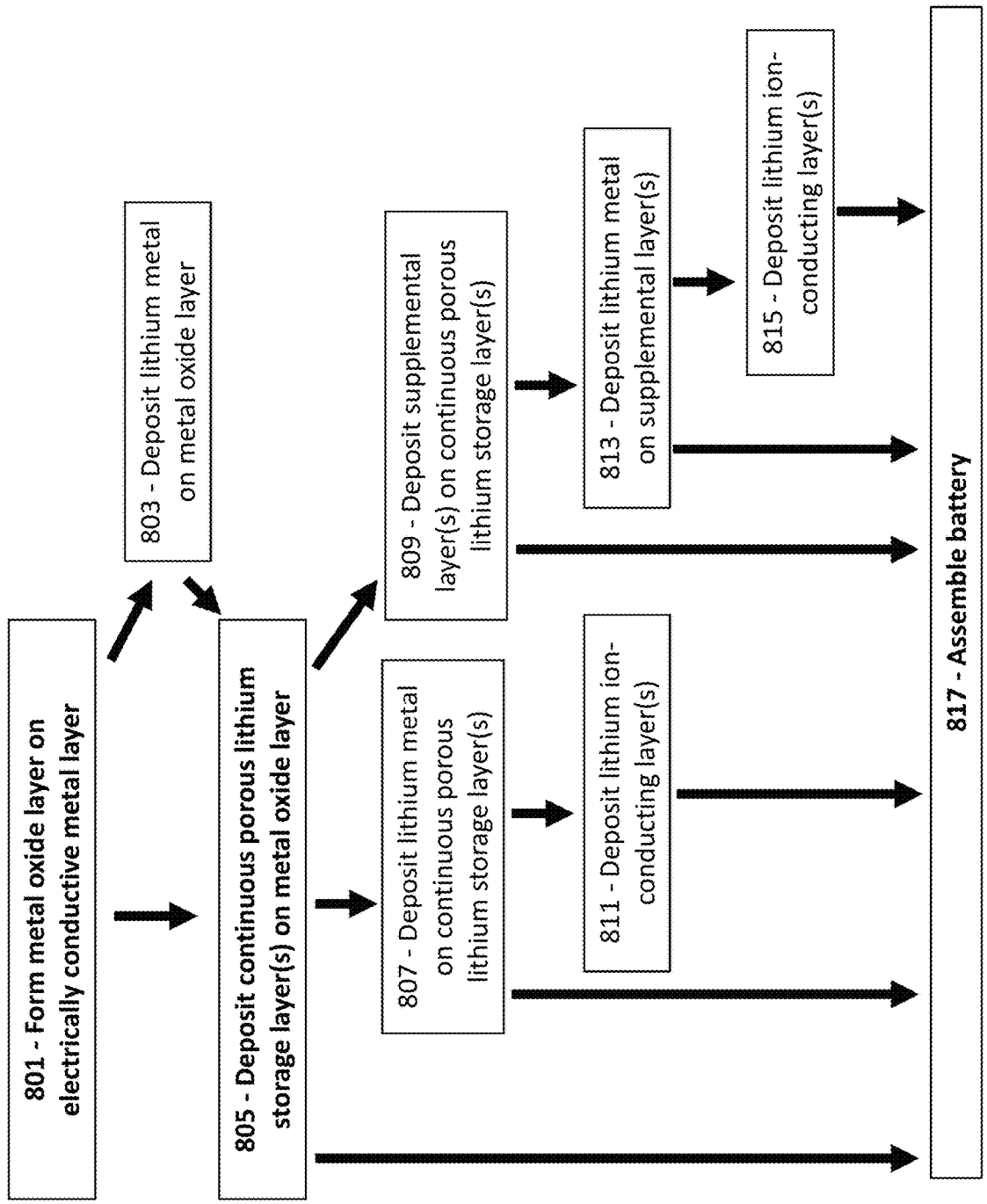
FIG. 8 is a process flow diagram for preparing anodes according to certain embodiments of the present disclosure.

As illustrated in FIG. 8, there are numerous process flow options for fabricating batteries incorporating anodes of the present disclosure. All of the steps of FIG. 8 have been discussed in more detail above and FIG. 8 is not an exhaustive list of all possibilities. In some embodiments, at least Steps 801, 805 and 817 are followed. In Step 801, a metal oxide layer is formed on an electrically conductive layer, e.g., an electrically conductive metal layer such as a metal foil or metal mesh. In Step 805, one or more continuous porous lithium storage layers are deposited over or onto the metal oxide layer. In an alternative embodiment, prior to step 805, lithium metal (or some other lithiation material) may be deposited onto the metal oxide layer as shown in Step 803. In some cases, the anode formed in Step 805 may be ready for assembly into a battery, Step 817.

In some embodiments, after Step 805, a prelithiation step may be included, e.g., Step 807 where lithium metal may be deposited onto the continuous porous lithium storage layer(s). In some cases, the anode from Step 807 may be ready to be assembled into a battery, Step 817. In other embodiments as shown in Step 811, one or more lithium ion-conducting layer(s) may be deposited onto the product of Step 807 prior to battery assembly Step 817.

In some embodiments, after Step 805, one or more supplemental layers may be deposited onto the continuous porous lithium storage layer(s), as shown in Step 809. In some cases, the anode from Step 809 may be ready for assembly into a battery, Step 817. In other embodiments, a prelithiation step may be included, e.g. as shown in Step 813 where lithium metal may be deposited over or onto the supplemental layer(s). In some cases, the anode from Step 813 may be ready for assembly into a battery, Step 817. In other embodiments, one or more lithium ion-conducting layer(s) may be deposited onto the product of Step 813 prior to battery assembly Step 817.

In addition to the explicit steps shown in FIG. 8, thermal treatments or other treatments may be performed between any of the steps. Further, as mentioned, additional lithium storage layers that are not continuous porous lithium storage layers may be coated after Step 805. In some embodiments one or more steps may be performed using roll-to-roll coating methods wherein the electrically conductive layer is in the form of a rolled film, e.g., a roll of metal foil.

Figure 9A:
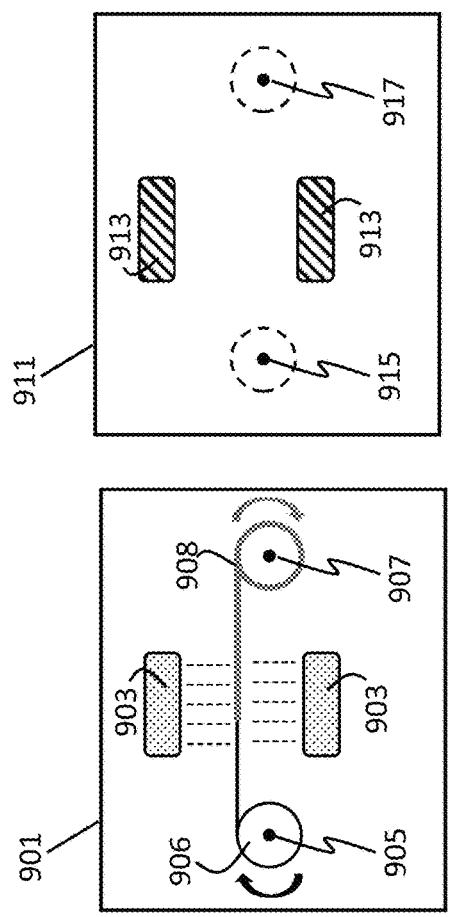
FIG. 9A is a schematic of apparatuses for roll-to-roll processing of anodes according to some embodiments of the present disclosure.

In some cases, as shown in schematic FIG. 9A, the roll-to-roll processing may performed within a particular step wherein the apparatus 901 for such step includes the necessary processing hardware 903, e.g., for depositing, forming or treating a layer, along with a loading tool 905 for holding a roll of film 906 to be processed, and a winding tool 907 to roll up the processed film 908 after the step is complete. To carry out the next step, the processed roll may be transferred to processing apparatus 911, having its own processing hardware 913, loading tool 915, and winding tool 917. During transfer, the rolls may be kept in a controlled environment, e.g., low oxygen or moisture, depending on the step.

Figure 9B:
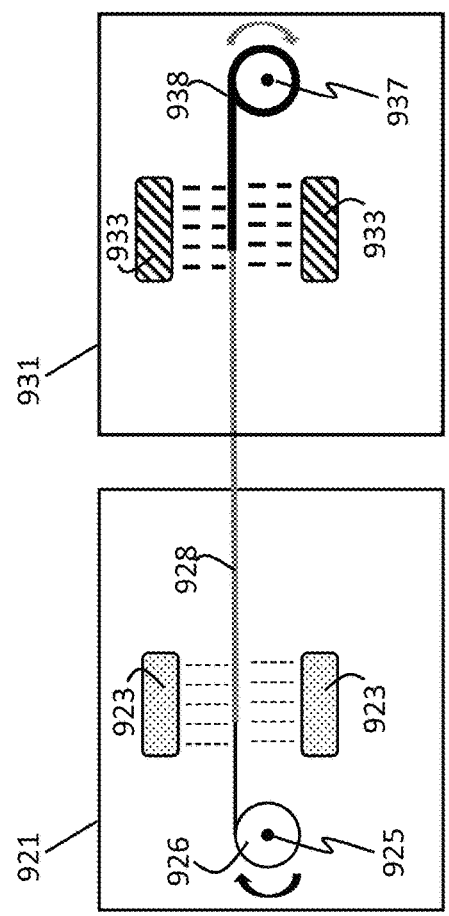
FIG. 9B is a schematic of apparatuses for roll-to-roll processing of anodes according to some embodiments of the present disclosure.

In some cases, the roll-to-roll processing may include transfer of the film processed in one step directly to the next step or apparatus as shown schematically in FIG. 9B. Processing apparatus 921 is analogous to apparatus 901, but without the winding tool. Apparatus 921 includes loading tool 925 for holding the roll of film 926 to be processed and appropriate processing hardware 923, e.g., for depositing, forming or treating a layer. The processed film 928 from the first step moves to processing apparatus 931 to receive another process step. Apparatus 931 includes the appropriate processing hardware 933, e.g., for depositing, forming or treating a layer, and a winding tool 937 to roll up the processed film 938 after the next step is complete. Not shown, the processed film 938 may instead move to yet another processing apparatus without winding. Also, while drawn as separate units, in some embodiments apparatus 921 and apparatus 931 may share a common chamber. In some embodiments, a transition chamber or zone may be provided between apparatus 921 and 931 designed to avoid contamination of one process with another, or to act as a film transport speed buffer if one process requires less time than another.

Various combinations of the above embodiments may be employed together, depending on the compatibility of one apparatus interfacing with another. Fabrication equipment may further include slitting stations.

Battery Features

The preceding description relates primarily to the anode (negative electrode) of a lithium-ion battery (LIB). The LIB typically includes a cathode (positive electrode), an electrolyte and a separator (if not using a solid-state electrolyte). As is well known, batteries can be formed into multilayer stacks of anodes and cathodes with an intervening separator. Alternatively, a single anode/cathode stack can be formed into a so-called jellyroll. Such structures are provided into an appropriate housing having desired electrical contacts.

In some embodiments, the battery may be constructed with confinement features to limit expansion of the battery, e.g., as described in US published applications 2018/0145367 and 2018/0166735, the entire contents of which are incorporated herein by reference for all purposes. In some embodiments a physical pressure is applied between the anode and cathode, e.g., using a tensioned spring or clip, a compressible film or the like. Confinement, pressure, or both confinement and pressure may help ensure that the anode remains in active contact with the current collector during formation and cycling, which may cause expansion and contraction of the continuous porous lithium storage layer. In some embodiments, a jelly-roll battery design using metallic or other hard cylindrical housings may provide effective confinement, pressure, or both confinement and pressure.

Figure 10:
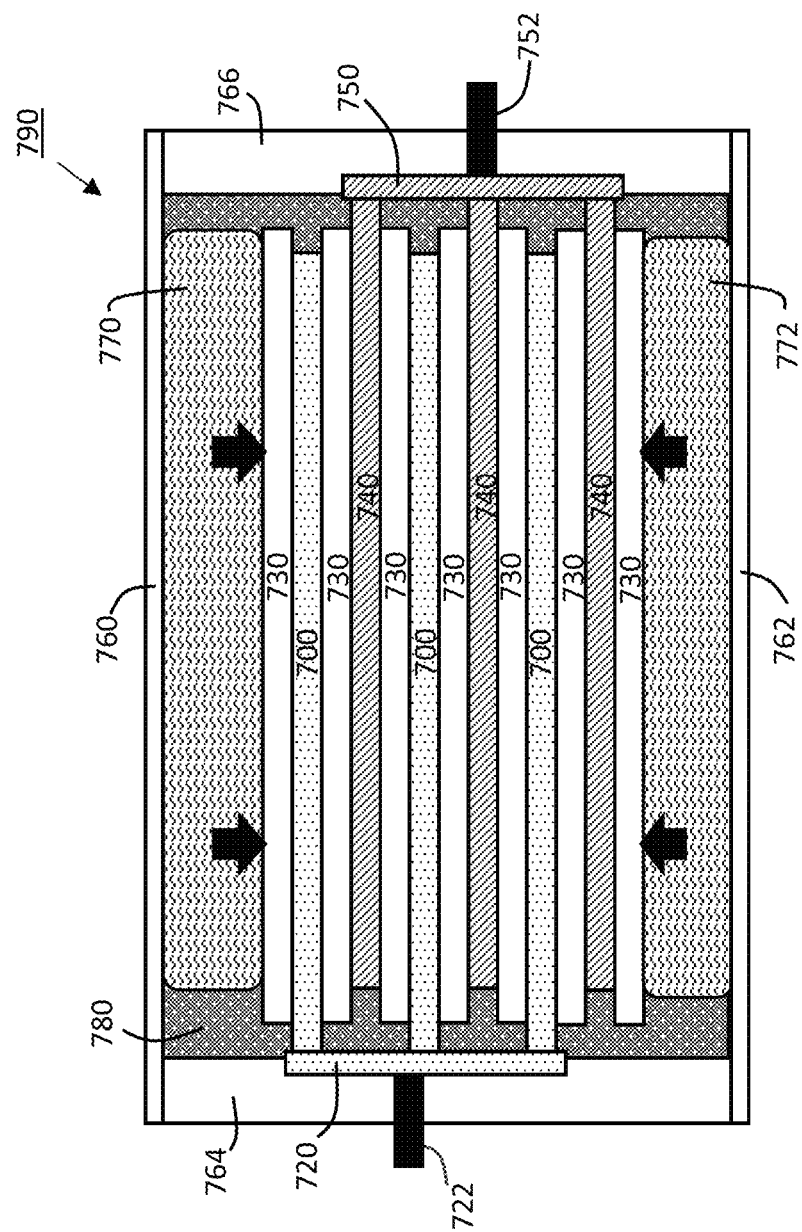
FIG. 10 is a cross-sectional view of a battery according to some embodiments of the present disclosure.

FIG. 10 is a schematic cross-sectional view of a battery according to some embodiments of the present disclosure. Battery 790 includes top plate 760, bottom plate 762, anode side plate 764 and cathode side plate 766, which form part of a housing for the stack of anodes 700, cathodes 740 and intervening separators 730. Anodes are attached to an anode bus 720 which is connected to anode lead 722 that extends through anode side plate 764. Cathodes are attached to a cathode bus 750 which is connected to cathode lead 752 that extends through cathode side plate 766. Battery 790 further includes electrolyte 780 which fills the space and saturates the separators 730. Top compression member 770 and lower compression member 772 apply physical pressure (arrows) between the anodes and cathodes. Compression members may be compressible films, e.g., made from a porous polymer or silicone. Alternatively, compression members may include an array of compressible features, e.g., made from porous polymer or silicone. Alternatively, the compression members may include springs or an array of springs. Alternatively, compression members may correspond to two sides of a compression clip or clamp. In some embodiments, the separator may act as a compressible film. In some embodiments the top and bottom plates may be formed a material and/or structured to resist deformation thereby confining battery swell.

Cathode

Positive electrode (cathode) materials include, but are not limited to, lithium metal oxides or compounds (e.g., $LiCoO_2$, $LiFePO_4$, $LiMnO_2$, $LiNiO_2$, $LiMn_2O_4$, $LiCoPO_4$, $LiNi_xCo_yMn_zO_2$, $LiNi_xCo_yAl_zO_2$, $LiFe_2(SO_4)_3$, or $Li_2FeSiO_4$), carbon fluoride, metal fluorides such as iron fluoride ($FeF_3$), metal oxide, sulfur, selenium, sulfur-selenium and combinations thereof. Cathode active materials are typically provided on, or in electrical communication with, an electrically conductive cathode current collector.

In some embodiments, a prelithiated anode of the present disclosure is used with cathode including sulfur, selenium, or both sulfur and selenium (collectively referred to herein as "chalcogen cathodes"). In some embodiments, a prelithiated anode of the present disclosure may be paired with a chalcogen cathode having an active material layer, wherein the active material layer may include a carbon material and a compound selected selected from the group consisting of $Se$, $Se_yS_x$, $Te_yS_x$, $Te_zSe_yS_x$, and combinations thereof, where x, y and z are any value between 0 and 1, the sum of y and x being 1, and the sum of z, y and x being 1, the compound impregnated in the carbon material, e.g., as described in US published application 2019/0097275, which is incorporated by reference herein for all purposes. The compound may be present in an amount of 9-90% by weight based on the total weight of the active material layer. In some embodiments, the chalcogen cathode active material layer further includes conductive carbon nanotubes to improve overall conductivity and physical durability and may permit faster charging and discharging. The presence of carbon nanotubes may further allow thicker coatings that have greater flexibility thereby allowing higher capacity.

Chalcogen cathodes are generally paired with lithium metal anodes. However, lithium metal anodes are difficult to handle, prone to degradation, and may further allow formation of dangerous dendritic lithium that can lead to catastrophic shorts. In some embodiments, prelithiated anodes of the present disclosure can achieve equivalent energy storage capacity of a pure lithium anode, but are much easier to handle and less prone to form dendritic lithium, thus making them more compatible with chalcogen cathodes.

Current Separator

The current separator allows ions to flow between the anode and cathode but prevents direct electrical contact. Such separators are typically porous sheets. Non-aqueous lithium-ion separators are single layer or multilayer polymer sheets, typically made of polyolefins, especially for small batteries. Most commonly, these are based on polyethylene or polypropylene, but polyethylene terephthalate (PET) and polyvinylidene fluoride (PVDF) can also be used. For example, a separator can have >30% porosity, low ionic resistivity, a thickness of ~10 to 50 μm and high bulk puncture strengths. Separators may alternatively include glass materials, ceramic materials, a ceramic material embedded in a polymer, a polymer coated with a ceramic, or some other composite or multilayer structure, e.g., to provide higher mechanical and thermal stability. As mentioned, the separator may include a lithiation material such as lithium metal, a reducing lithium compound, or an SLMP material coated at least on the side facing the anode.

Electrolyte

The electrolyte in lithium ion cells may be a liquid, a solid, or a gel. A typical liquid electrolyte comprises one or more solvents and one or more salts, at least one of which includes lithium. During the first few charge cycles (sometimes referred to as formation cycles), the organic solvent and/or the electrolyte may partially decompose on the negative electrode surface to form an SEI (Solid-Electrolyte-Interphase) layer. The SEI is generally electrically insulating but ionically conductive, thereby allowing lithium ions to pass through. The SEI may lessen decomposition of the electrolyte in the later charging cycles.

Some non-limiting examples of non-aqueous solvents suitable for some lithium ion cells include the following: cyclic carbonates (e.g., ethylene carbonate (EC), fluoroethylene carbonate (FEC), propylene carbonate (PC), butylene carbonate (BC) and vinylethylene carbonate (VEC)), vinylene carbonate (VC), lactones (e.g., gamma-butyrolactone (GBL), gamma-valerolactone (GVL) and alpha-angelica lactone (AGL)), linear carbonates (e.g., dimethyl carbonate (DMC), methyl ethyl carbonate (MEC, also commonly abbreviated EMC), diethyl carbonate (DEC), methyl propyl carbonate (MPC), dipropyl carbonate (DPC), methyl butyl carbonate (NBC) and dibutyl carbonate (DBC)), ethers (e.g., tetrahydrofuran (THF), 2-methyltetrahydrofuran, 1,4-dioxane, 1,2-dimethoxyethane (DME), 1,2-diethoxyethane and 1,2-dibutoxyethane), nitriles (e.g., acetonitrile and adiponitrile) linear esters (e.g., methyl propionate, methyl pivalate, butyl pivalate and octyl pivalate), amides (e.g., dimethyl formamide), organic phosphates (e.g., trimethyl phosphate and trioctyl phosphate), organic compounds containing an S=O group (e.g., dimethyl sulfone and divinyl sulfone), and combinations thereof.

Non-aqueous liquid solvents can be employed in combination. Examples of these combinations include combinations of cyclic carbonate-linear carbonate, cyclic carbonate-lactone, cyclic carbonate-lactone-linear carbonate, cyclic carbonate-linear carbonate-lactone, cyclic carbonate-linear carbonate-ether, and cyclic carbonate-linear carbonate-linear ester. In some embodiments, a cyclic carbonate may be combined with a linear ester. Moreover, a cyclic carbonate may be combined with a lactone and a linear ester. In some embodiments, the weight ratio, or alternatively the volume ratio, of a cyclic carbonate to a linear ester is in a range of 1:9 to 10:1, alternatively 2:8 to 7:3

A salt for liquid electrolytes may include one or more of the following non-limiting examples: $LiPF_6$, $LiBF_4$, $LiClO_4$, $LiAsF_6$, $LiN(CF_3SO_2)_2$, $LiN(C_2F_5SO_2)_2$, $LiCF_3SO_3$, $LiC(CF_3SO_2)_3$, $LiPF_4(CF_3)_2$, $LiPF_3(C_2F_5)_3$, $LiPF_3(CF_3)_3$, $LiPF_3(iso-C_3F_7)_3$, $LiPF_5(iso-C_3F_7)$, lithium salts having cyclic alkyl groups (e.g., $(CF_2)_2(SO_2)_{2x}Li$ and $(CF_2)_3(SO_2)_{2x}Li$), and combinations thereof. Common combinations include: $LiPF_6$ and $LiBF_4$; $LiPF_6$ and $LiN(CF_3SO_2)_2$; and $LiBF_4$ and $LiN(CF_3SO_2)_2$.

In some embodiments, the total concentration of salt in a liquid non-aqueous solvent (or combination of solvents) is at least 0.3 M, alternatively at least 0.7M. The upper concentration limit may be driven by a solubility limit and operational temperature range. In some embodiments, the concentration of salt is no greater than about 2.5 M, alternatively no more than about 1.5 M.

In some embodiments, the battery electrolyte includes a non-aqueous ionic liquid and a lithium salt.

A solid electrolyte may be used without the separator because it serves as the separator itself. It is electrically insulating, ionically conductive, and electrochemically stable. In the solid electrolyte configuration, a lithium containing salt, which could be the same as for the liquid electrolyte cells described above, is employed but rather than being dissolved in an organic solvent, it is held in a solid polymer composite. Examples of solid polymer electrolytes may be ionically conductive polymers prepared from monomers containing atoms having lone pairs of electrons available for the lithium ions of electrolyte salts to attach to and move between during conduction, such as polyvinylidene fluoride (PVDF) or chloride or copolymer of their derivatives, poly(chlorotrifluoroethylene), poly(ethylene-chlorotrifluoro-ethylene), or poly(fluorinated ethylene-propylene), polyethylene oxide (PEO) and oxymethylene linked PEO, PEO-PPO-PEO crosslinked with trifunctional urethane, poly(bis(methoxy-ethoxy-ethoxide))-phosphazene (MEEP), triol-type PEO crosslinked with difunctional urethane, poly((oligo)oxyethylene)methacrylate-co-alkali metal methacrylate, polyacrylonitrile (PAN), polymethylmethacrylate (PMMA), polymethylacrylonitrile (PMAN), polysiloxanes and their copolymers and derivatives, acrylate-based polymer, other similar solvent-free polymers, combinations of the foregoing polymers either condensed or cross-linked to form a different polymer, and physical mixtures of any of the foregoing polymers. Other less conductive polymers that may be used in combination with the above polymers to improve the strength of thin laminates include: polyester (PET), polypropylene (PP), polyethylene naphthalate (PEN), polyvinylidene fluoride (PVDF), polycarbonate (PC), polyphenylene sulfide (PPS), and polytetrafluoroethylene (PTFE). Such solid polymer electrolytes may further include a small amount of organic solvents listed above. The polymer electrolyte may be an ionic liquid polymer. Such polymer-based electrolytes can be coated using any number of conventional methods such as curtain coating, slot coating, spin coating, inkjet coating, spray coating or other suitable method.

Additives may be included in the electrolyte to serve various functions. For example, additives such as polymerizable compounds having an unsaturated double bond may be added to stabilize or modify the SEI. Certain amines or borate compounds can act as cathode protection agents. Lewis acids can be added to stabilize fluorine-containing anion such as $PF_6^-$. Safety protection agents include those to protect overcharge, e.g., anisoles, or act as fire retardants, e.g., alkyl phosphates.

In some embodiments, a solid-state electrolyte may be vapor deposited, solution-coated, melt-coated, or a combination thereof. Whether vapor deposited or coated from a solution or melt, embodiments of the present disclosure are advantageous over nanostructured devices. In the case of vapor deposited solid-state electrolytes, anodes of the present disclosure do not have the problem of physical "shadowing" that nano- or micro-structured devices do. Shadowing will create non-uniform deposition of the electrolyte. The anodes disclosed here generally do not have high aspect ratio structures as described above, resulting in no or low shadowing effects. Vapor deposited solid electrolytes can be deposited uniformly and rapidly over anodes of the present disclosure without resorting to slow atomic layer or other conformal coating methods. In the case of solution or melt-deposited solid-state electrolytes, anodes of the present disclosure may be more robust to the stresses and shear forces caused by the coating operation. High aspect ratio nano- or micro-structures are susceptible to breakage from such forces.

In some embodiments, the original, non-cycled anode may undergo structural or chemical changes during electrochemical charging/discharging, for example, from normal battery usage or from an earlier "electrochemical formation step". As is known in the art, an electrochemical formation step is commonly used to form an initial SEI layer and involves relatively gentle conditions of low current and limited voltages. The modified anode prepared in part from such electrochemical charging/discharging cycles may still have excellent performance properties, despite such structural and/or chemical changes relative to the original, non-cycled anode.

EXAMPLES

For Anodes 1-10, current collectors having a metal oxide layer (a nickel oxide) over an electrically conductive metal layer (nickel) were prepared by placing nickel foil in a muffle furnace (heated air) and holding the foil at 700° C. for 30 minutes then cooled to room temperature. The metal oxide thickness was approximately 0.7 to 1.2 microns.

Anode 1 (No Supplemental Layer)

The current collector was placed in a high-density plasma-enhanced chemical vapor deposition tool (HDPECVD) using silane gas as the source of silicon and argon carrier gas. Amorphous silicon was deposited over one side of the nickel foil at a total loading of about 0.8 mg/cm$^2$ to form the continuous porous lithium storage layer having a thickness of about 4 μm.

Anode 2 ($Si_3N_4$ Supplemental Layer)

Anode 2 was prepared in the same way as Anode 1, but prior to removal from the HDPECVD tool, a nitrogen source was added to the silane/Ar gas mixture and 30 nm of substantially stoichiometric silicon nitride was deposited to form a supplemental layer over the continuous porous lithium storage layer (a-Si).

Anode 3 ($Si_3N_4/TiO_2$ Supplemental Layers)

Anode 3 was prepared in the same way as Anode 1, but prior to removal from the HDPECVD tool, a nitrogen source was added to the silane/Ar gas mixture and 15 nm of substantially stoichiometric silicon nitride was deposited to form a first supplemental layer over the continuous porous lithium storage layer (a-Si). The anode was transferred to an ALD tool and 6 nm titanium dioxide was deposited over the first supplemental layer to form a second supplemental layer.

Half Cells

Half cells were constructed using a 1.27 cm diameter punch of each anode. Lithium metal served as the counter electrode which was separated from the test anode using Celgard™ separators. The electrolyte solution included: a) 88 wt. % of 1.0 M $LiPF_6$ in 3:7 EC:EMC (weight ratio); b) 10 wt. % FEC; and c) 2 wt. % VC. Anodes first underwent an electrochemical formation step. As is known in the art, the electrochemical formation step is used to form an initial SEI layer. Relatively gentle conditions of low current and/or limited voltages may be used to ensure that the anode is not overly stressed. For example, electrochemical formation may include several cycles at low C-rates ranging from C/20 to C/5. While silicon has a theoretical charge capacity of about 3600 mAh/g when used in lithium-ion batteries, it has been found that cycle life significantly improves if only a portion of the full capacity is used. Unless otherwise noted, the performance cycling was set to use about a third of the total capacity, i.e., about 1200 mAh/g ("capacity rating"). Unless otherwise notes, the performance cycling protocol generally included 3 C charging and C/3 discharging to roughly a 20% state of charge. A 10-minute rest was provided between charging and discharging cycles.

Figure 11:
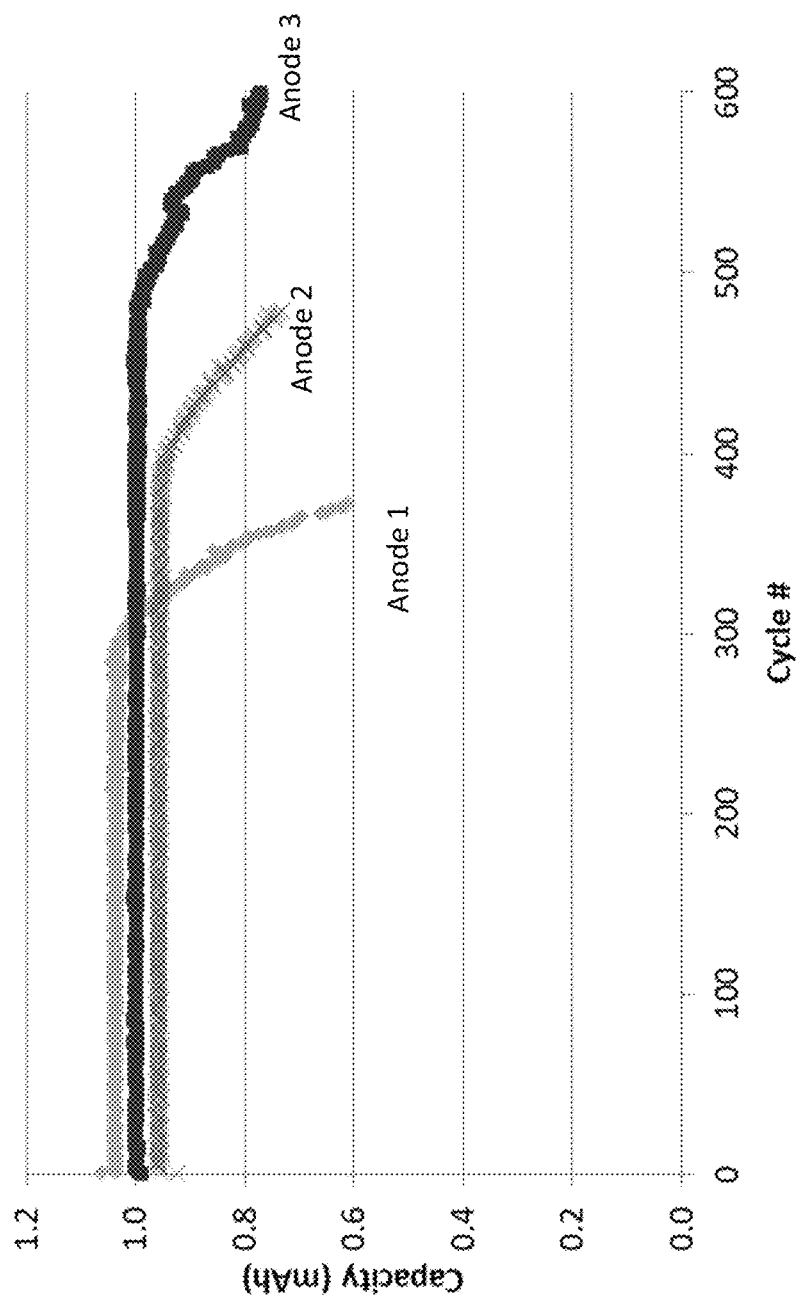
FIG. 11 show cycling performance data for anodes according to some embodiments of the present disclosure.

Plots of discharge capacity as a function of cycle # are shown in FIG. 11. All anodes have good cycle life even under these aggressive charging conditions (3 C). Anode 1 lasted about 300 cycles before showing signs of decay. Adding a supplemental layer extended cycle life of Anode 2 to about 400 cycles before signs of decay (an increase of ~30%), with only a minor loss of overall starting capacity (about 10%). Further, when it occurs, the rate of decay was substantially lower than Anode 1. Adding first and second supplemental layers extended the cycle life of Anode 3 to almost 500 cycles before signs of decay (an increase of ~60% over Anode 1) with an even smaller loss of overall capacity (about 5%). Further, when it occurs, the rate of decay was substantially lower than Anode 1. Cycle life in terms of cycles to 80% of initial charge capacity for Anodes 1-3 are tabulated below in Table 1 along with other anodes.

Additional anodes were prepared and tested in half cells in a manner similar to that described above.

Anode 4 (No Supplemental Layer)

Anode 4 was substantially the same as Anode 1. The continuous porous lithium storage layer included amorphous silicon having a thickness of about 4 μm and a density in range of about 1.8 to 2.0 g/cm$^3$.

Anode 5 ($Si_3N_4/Al_2O_3$ Supplemental Layers)

Anode 5 was substantially the same as Anode 4, but prior to removal from the HDPECVD tool, a nitrogen source was added to the silane/Ar gas mixture and 15 nm of substantially stoichiometric silicon nitride was deposited to form a first supplemental layer over the continuous porous lithium storage layer (a-Si). The anode was transferred to an ALD tool and 6 nm of aluminum oxide was deposited over the silicon nitride. In subsequent testing below, this cell did not survive electrochemical formation step. Thus, in some embodiments, when using a first supplemental layer of silicon nitride, it may be preferred not to use aluminum oxide as the second supplemental layer. Surprisingly, aluminum oxide performs poorly, and titanium dioxide appears to be a better second supplemental layer in this case.

Anode 6 ($TiO_2/Al_2O_3$ Supplemental Layers)

Anode 6 was similar to Anode 4 except that multiple supplemental layers were deposited by ALD. The first supplemental layer included 10 nm titanium dioxide and the second supplemental layer included 4 nm aluminum oxide. As shown in Table 1 below, the cycle life is substantially improved over Anode 4 without the supplemental layers.

Anode 7 ($Al_2O_3/TiO_2$ Supplemental Layers)

Anode 6 was similar to Anode 4 except that multiple supplemental layers were deposited by ALD. The first supplemental layer included 10 nm aluminum oxide and the second supplemental layer included 4 nm titanium dioxide. As shown in Table 1, the cycle life was acceptable, but not as good as Anode 4 without a supplemental layer and much lower than Anode 5 having the reverse supplemental layer structure. While there may be other reasons to use the structure of Anode 7, in some embodiments, when using multiple metal oxide supplemental layer, it may be preferred not to use aluminum oxide as the first supplemental layer. Surprisingly, aluminum oxide performs poorly, and titanium dioxide appears to be a better first supplemental layer in this case.

Anode 8 (60 nm $SiO_2$ Supplemental Layer)

Anode 8 was similar to Anode 4, but prior to removal from the HDPECVD tool, oxygen gas was added to the silane/Ar gas mixture and 60 nm of substantially stoichiometric silicon dioxide was deposited to form a supplemental layer over the continuous porous lithium storage layer (a-Si). As shown in Table 1, the silicon dioxide causes a reduction in areal charge capacity, but the cycle life can be substantially improved. By increasing the capacity rating to 1600 mAh/g, the areal charge capacity can be recovered so that is similar to Anode 4, and cycle life is still extended.

Anode 9 (120 nm $SiO_2$ Supplemental Layer)

Anode 9 was similar to Anode 8, except that 120 nm of substantially stoichiometric silicon dioxide was deposited. As shown in Table 1, the silicon dioxide causes a reduction in areal charge capacity, but the cycle life can be substantially improved. By increasing the capacity rating to 1600 mAh/g, the areal charge capacity can be recovered so that is similar to Anode 4, and cycle life is still extended.

Anode 10 (SiOx Lithium Storage Sublayer)

Anode 10 was similar to Anode 4 but prior to removal from the HDPECVD tool, an oxygen gas was added to the gas mixture and about 250 nm of sub-stoichiometric silicon oxide was deposited to form a lithium storage sublayer over the amorphous silicon. The stoichiometry of the SiOx sublayer is not known with certainty, but the oxygen gas flow rate was set to only about 12% of the rate used to make a substantially stoichiometric silicon dioxide. The overall thickness and density of the combined sublayers of a-Si and SiOx was about 4.5 μm and 2.1 $g/cm^3$, respectively As shown in Table 1, Anode 10 has improved cycle life relative to Anode 4 not having the SiOx sublayer. Note that the cycle life in Table 1 is the average of two replicates.

TABLE 1

Various performance parameters of Anodes 1-10, all at 3 C charging C/3 discharge

| | Parameter | | |
|---|---|---|---|
| Anode # | Capacity rating (mAh/g) | Initial charge capacity (mAh/cm$^2$) | Cycles to 80% of initial charge capacity |
| 1 | 1197 | 0.83 | 347 |
| 2 | 1202 | 0.77 | 472 |
| 3 | 1201 | 0.79 | 580 |
| 4 | 1237 | 0.83 | 354 |
| 5 | Failed electrochemical formation | | |
| 6 | 1214 | 0.76 | 498 |
| 7 | 1214 | 0.76 | 273 |
| 8 | 1228 | 0.65 | 689 |
| 8 | 1573 | 0.83 | 583 |
| 9 | 1204 | 0.57 | 977 |
| 9 | 1584 | 0.76 | 616 |
| 10 | 1123 | 0.76 | 576 |

Anode 11

A different current collector was prepared for Anode 11. Specifically, a 50 nm $TiO_2$ (metal oxide) layer was deposited by ALD onto an electrically conductive commercial copper foil. Silicon was deposited onto the $TiO_2$ using an Oxford Plasmalabs System 100 PECVD tool at about 300° C. operated for 50 minutes at an RF power of about 225 W. The deposition gas was a mixture of silane and argon with gas flow ratio of about 1 to 11, respectively, along with a boron-containing dopant gas. No hydrogen gas was used. An adherent boron-doped amorphous silicon film about 14 μm thick having a density of about 1.7 $g/cm^3$ was deposited.

Anodes 11A-11E

After silicon deposition, samples of Anode 11 were transferred to a tube furnace under argon and thermally treated for various times and temperatures to form Anodes 11A-11E as shown in Table 2 below.

Anodes 11 and 11A-11E were tested in half cells as previously described except, due to larger charge capacity, the cell punch size was reduced. At the end of the formation cycles, the full areal charge capacity was measured electrochemically along with final formation cycle current efficiency. These data are also found in Table 2.

TABLE 2

Anode thermal treatment time and temperature

| Anode | Time (min) | Temp (° C.) | Full areal charge capacity (mAh/cm$^2$) | Coulombic efficiency final formation cycle (%) |
|---|---|---|---|---|
| 11 | n/a | n/a | 6.0 | 99 |
| 11A | 60 | 475 | 6.5 | 99 |
| 11B | 15 | 475 | 6.7 | 99 |
| 11C | 120 | 475 | 6.9 | 99 |
| 11D | 15 | 375 | 6.0 | 99 |
| 11E | 15 | 575 | 6.5 | 99 |

Although all anodes have very high areal charge capacity, the date in Table 2 show that anode thermal treatments appear to unlock some additional charge capacity when treated at 475° C. or 575° C. (about 8% to 15% more than Anode 11 without the thermal treatment). Such improvements are commercially significant in lithium ion batteries and can be used to: increase the charge capacity of the cell; decrease the weight and/or volume of the cell while maintaining cell charge capacity; increase the cycle life by lowering the rated capacity while maintaining overall cell charge capacity; or some combination.

Figure 12:
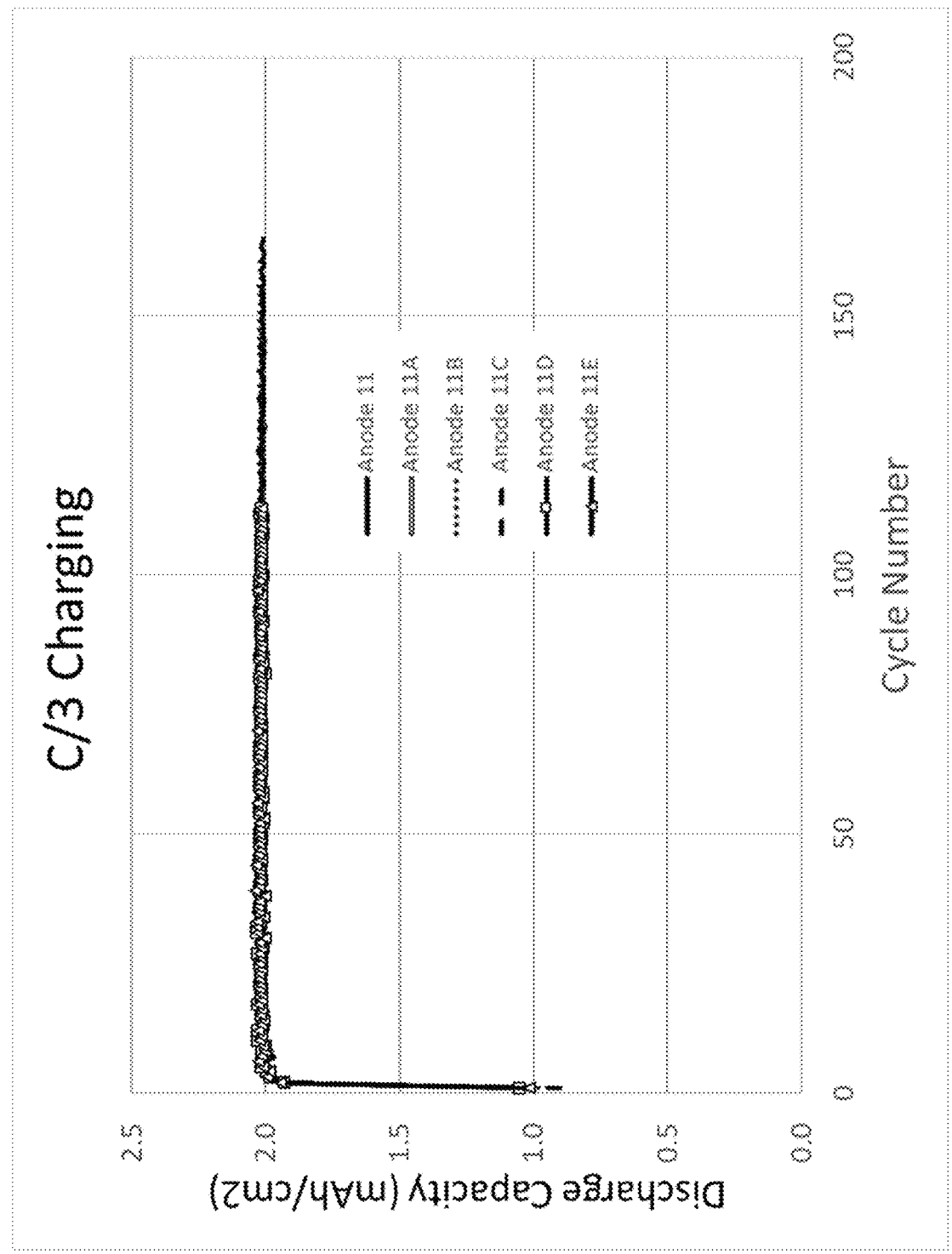
FIG. 12 show cycling performance data for anodes according to some embodiments of the present disclosure.

The performance of Anodes 11 and 11A-11E under cycling conditions were tested as described previously, but at C/3, 1 C and 3.2 C charging (all with C/3 discharge). The anodes were capacity-rated at about 1100 mAh/g. For C/3 and 1 C charging schedules, cells were cycled to a target initial areal charge capacity of 2.0 mAh/cm$^2$. The high charge rate 3.2 C test is completed with a charging current of 3.2 C, with a total time limit of 15 min. This is a common fast charging test performed in the trade (see "Battery Test Manual for Electric Vehicles", Jon P. Christophersen, June 2015, INL/EXT-15-34184 Revision 3, page 5) If the cell completes all of its charging galvanostatically, it will achieve 3.2*0.25 or 80% of its rated capacity, which in this case is 1.6 mAh/cm$^2$. Cells that hit the charging voltage limit prior to 15 min, will charge both galvanostatically and potentiostatically. The latter charging portion will result in cells achieving less than 80% of their rated capacity. None of these anodes have finished cycling or reached their 80% of the initial charge capacity (except Anode 11A which did so at about 400 cycles), but plots are shown in FIG. 12 (C/3 charge), FIG. 13 (1 C) and FIG. 14 (3.2 C). The test cells were not all started at the same time, so they are at various stages of cycling.

Inspection of FIG. 12 shows that there is not yet any substantial difference between the anodes at C/3 charging.

Figure 13:
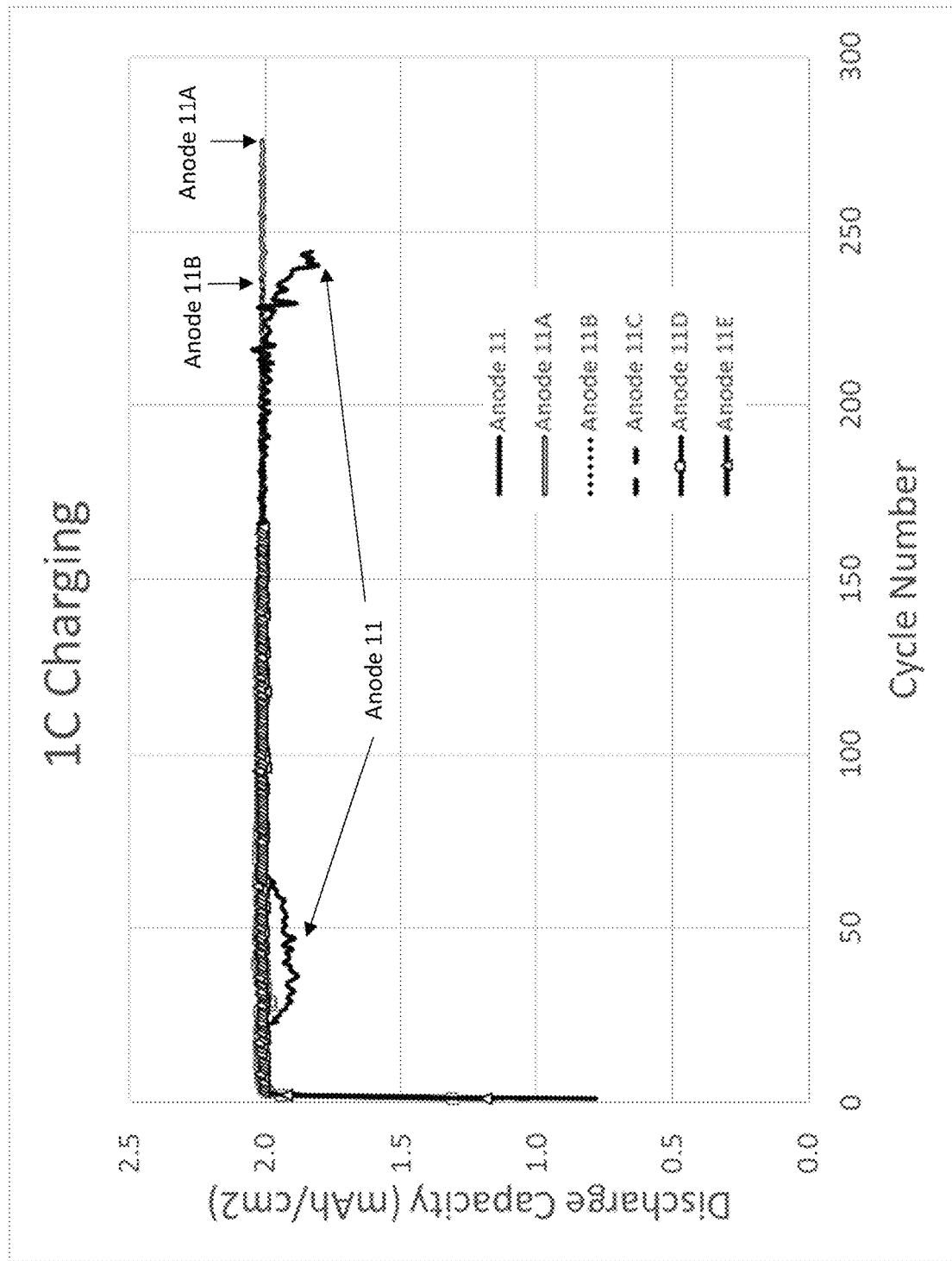
FIG. 13 show cycling performance data for anodes according to some embodiments of the present disclosure.

FIG. 13 reveals a dip in Anode 11 performance at cycles 25-60 relative to all of the other anodes. It also appears that Anode 11 is showing some cycle fading starting at about cycle 225. Of the two thermally treated anodes that have reached at least 230 cycles at this writing (11A@276 cycles and 11B@237 cycles), no such fading has been observed. Thus, at faster charge rates than C/3, the thermally treated anodes appear to show improved cycle life.

Figure 14:
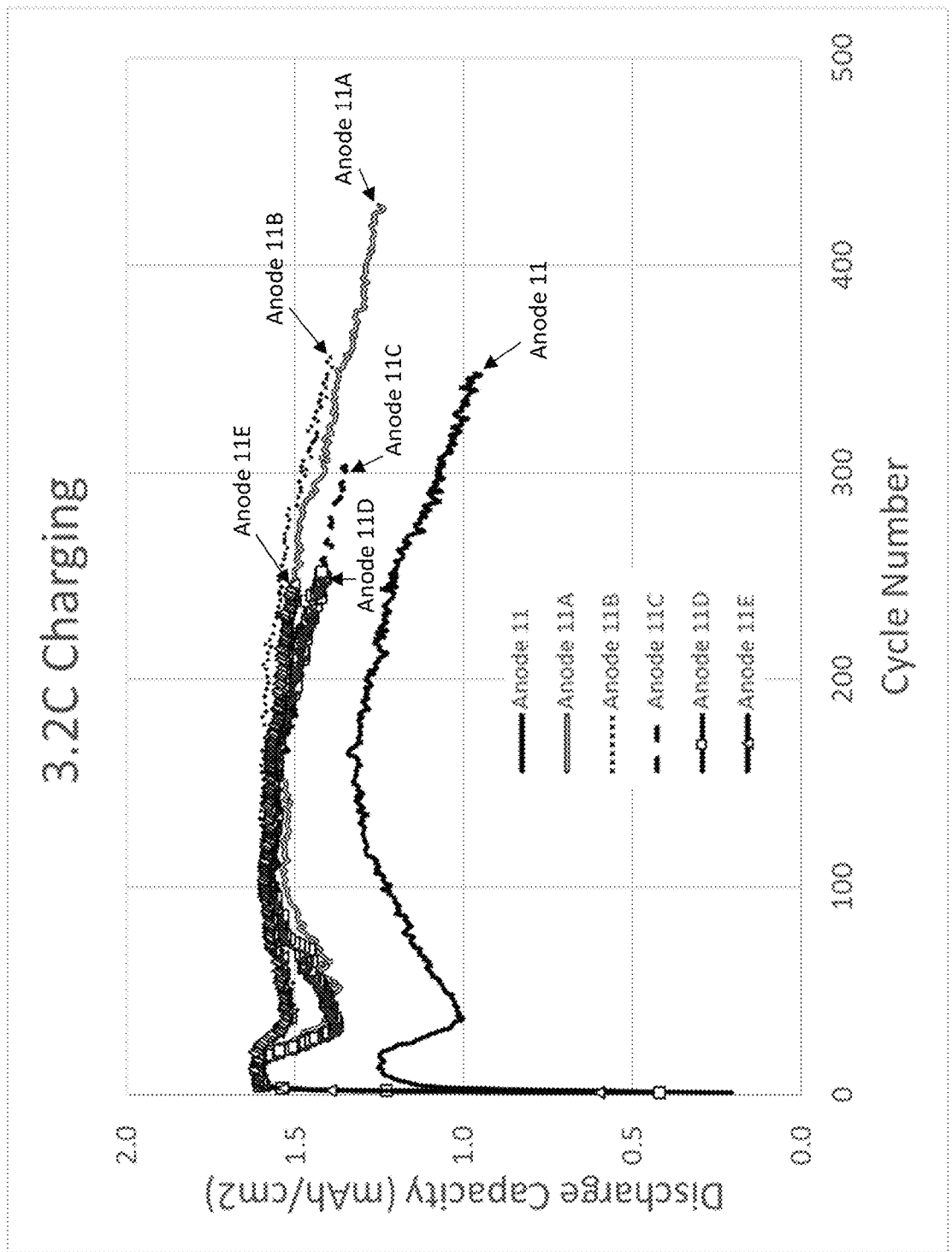
FIG. 14 show cycling performance data for anodes according to some embodiments of the present disclosure.

FIG. 14 shows that the non-thermally treated Anode 11 never reaches 80% state of charge at 3.2 C, i.e., instead of 1.6 mAh/cm$^2$, Anode 11 only reaches about 1.25 mAh/cm$^2$.

Due to its more resistive properties, it does not complete 15 min. of galvanostatic charging. In contrast, the thermally treated anodes do hit 80% state of charge for at least a few cycles; the fact that their capacities are closer to the 1.6 mAh/cm2 limiting capacity indicates most of their charging remains galvanostatic. It is postulated that the combination of very fast charging of 3.2 C in combination with the high-capacity silicon anode (relative to Anodes 1-10) may have resulted in some resistance in the flow of electrons or lithium diffusion. However, it is noted that all of the thermally treated samples, Anodes 11A-11E, were much closer to the target charge capacity than Anode 11, which did not have the thermal treatment. Thus, it appears that anode thermal treatments may be used to improve fast charging characteristics of the anode.

Despite the industry's advocacy of micro- or nanostructured silicon or other lithium storage materials, it has been found in the present disclosure that highly effective anodes can be formed without such features. Although the present anodes have been discussed with reference to batteries, in some embodiments the present anodes may be used in hybrid capacitor devices. Relative to comparable micro- or nanostructured anodes, the anodes of the present disclosure may have one or more of at least the following unexpected advantages: comparable or improved stability at aggressive ≥1 C charging rates; higher overall areal charge capacity; higher gravimetric charge capacity; higher volumetric charge capacity; improved physical durability; simplified manufacturing process; and/or a more reproducible manufacturing process.

Although the present anodes have been discussed with reference to batteries, in some embodiments the present anodes may be used in hybrid lithium ion capacitor devices. Some non-limiting representative embodiments are listed below.

1. An anode for an energy storage device comprising:
   a current collector comprising a metal oxide layer; and
   a continuous porous lithium storage layer overlaying the metal oxide layer.

2. The anode of embodiment 1, further comprising a first supplemental layer overlaying the continuous porous lithium storage layer, the first supplemental layer comprising silicon nitride, silicon dioxide, silicon oxynitride, or a first metal compound.

3. The anode of embodiment 2, wherein the first supplemental layer comprises silicon nitride having a thickness in a range of about 2 nm to about 50 nm.

4. The anode of embodiment 2 wherein the first supplemental layer comprises silicon dioxide and has a thickness in a range of about 10 nm to about 150 nm.

5. The anode of embodiment 2, wherein the first supplemental layer comprises a first metal compound selected from the group consisting of a metal oxide, a metal nitride, and a metal oxynitride, and has a thickness of about 2 nm to about 50 nm 6. The anode of embodiment 5, wherein the first metal compound is a transition metal oxide.

7. The anode of embodiment 5, wherein the first metal compound is titanium dioxide.

8. The anode according to any of embodiments 2-7, further comprising a second supplemental layer characterized by a composition different than the first supplemental layer composition, and comprising silicon dioxide, silicon nitride, silicon oxynitride, or a second metal compound.

9. The anode of embodiment 8, wherein the second metal compound comprises a metal oxide, metal nitride, or metal oxynitride, and wherein the second supplemental layer has a thickness in a range of about 2 nm to about 50 nm.

10. The anode of embodiment 9, wherein the first supplemental layer comprises silicon nitride and the second supplemental layer comprises titanium dioxide.

11. The anode of embodiment 10, wherein:
   (i) the first supplemental comprises substantially stoichiometric silicon nitride and has a thickness in a range of about 2 nm to about 50 nm; and
   (ii) the second supplemental layer comprises titanium dioxide and has a thickness in a range of about 2 nm to about 20 nm.

12. The anode of embodiment 8, wherein the first supplemental layer comprises titanium dioxide and has a thickness of about 2 nm to about 20 nm.

13. The anode of embodiment 12, wherein the second supplemental layer comprises aluminum oxide having a thickness of about 2 nm to about 20 nm.

14. The anode of embodiment 8, wherein:
   (i) the first supplemental layer does not comprise aluminum oxide; and
   (ii) the second supplemental layer does not comprise aluminum oxide when the first supplemental layer comprises substantially stoichiometric silicon nitride.

15. The anode of embodiment 8, wherein the second metal compound is a lithium-containing material.

16. The anode of embodiment 15, wherein the lithium-containing material comprises a lithium phosphorous oxynitride, a lithium phosphate, a lithium aluminum oxide, or a lithium lanthanum titanate.

17. The anode of embodiment 8, wherein the second supplemental layer comprises a metalcone.

18. The anode according to any of embodiments 15-17, wherein the second supplemental layer has a thickness in a range of about 5 nm to about 150 nm.

19. The anode according to any of embodiments 8-18, further comprising one or more additional supplemental layers overlaying the first and second supplemental layers, wherein at least one of the additional layers comprises a metal oxide, a metal nitride, a metal oxynitride, a lithium-containing material, or a metalcone.

20. The anode according to any of embodiments 1-19, wherein the continuous porous lithium storage layer comprises a first lithium storage sublayer overlaying the metal oxide layer and a second lithium storage sublayer overlaying the first lithium storage sublayer, and wherein the first lithium storage sublayer is characterized by a composition that is different than that of the second lithium storage sublayer.

21. The anode of embodiment 20, wherein each lithium storage sublayer has a composition comprising silicon, germanium, or a combination thereof.

22. The anode of embodiment 20 or 21, wherein the first or second lithium storage sublayer comprises silicon and oxygen, wherein the ratio of oxygen to silicon is in a range of 0.02 to 0.95.

23. The anode of embodiment 20 or 21, wherein i) second lithium storage sublayer comprises silicon and oxygen, wherein the ratio of oxygen to silicon is in a range of 0.02 to 0.95, ii) the first lithium storage sublayer comprises a higher silicon atomic % and a lower oxygen atomic % than the second lithium storage sublayer, and iii) the second lithium storage sublayer thickness is less than the first lithium storage sublayer thickness.

24. The anode according to any of embodiments 20-22, wherein the first or second lithium storage sublayer comprises silicon and nitrogen, wherein the ratio of nitrogen to silicon is in a range of 0.02 to 0.95.

25. The anode according to any of embodiments 20-22, wherein the first or second lithium storage sublayer comprises silicon, oxygen, and nitrogen, wherein the ratio of total oxygen and nitrogen atoms to silicon is in a range of 0.02 to 0.95.

26. The anode according to any of embodiments 1-19, wherein the continuous porous lithium storage layer comprises:
  i) silicon and oxygen, wherein the ratio of oxygen atoms to silicon atoms is in a range of 0.02 to 0.95;
  ii) silicon and nitrogen, wherein the ratio of nitrogen atoms to silicon atoms is in a range of 0.02 to 0.95; or
  iii) silicon, oxygen, and nitrogen, wherein the ratio of total oxygen and nitrogen atoms to silicon atoms is in a range of 0.02 to 0.95.

27. The anode according to any of embodiments 1-26, wherein the metal oxide layer comprises an oxide of an alkali metal or an alkaline earth metal.

28. The anode of embodiment 27, wherein the metal oxide layer comprises an oxide of lithium.

29. The anode according to any of embodiments 1-28, wherein the metal oxide layer comprises an oxide of a transition metal.

30. The anode of embodiment 29, wherein the metal oxide layer comprises an oxide of nickel or an oxide of titanium.

31. The anode according to any of embodiments 1-30, wherein the metal oxide layer further comprises a metal hydroxide.

32. The anode of embodiment 31, wherein the metal oxide layer has a ratio of oxygen atoms in the form of hydroxide relative to oxide of less than 0.25.

33. The anode according to any of embodiments 1-32, wherein the metal oxide layer has an average thickness in a range of about 0.010 µm to about 1.0 µm.

34. The anode according to any of embodiments 1-33, wherein the continuous porous lithium storage layer has a total content of silicon, germanium, or a combination thereof, of at least 40 atomic %.

35. The anode according to any of embodiments 1-34, wherein the continuous porous lithium storage layer comprises at least 85 atomic % amorphous silicon having a density in a range of about 1.1 g/cm$^3$ to 2.2 g/cm$^3$.

36. The anode according to any of embodiments 1-35, wherein the continuous porous lithium storage layer has a thickness of at least 3 µm.

37. The anode according to any of embodiments 1-37, wherein the continuous porous lithium storage layer has a thickness in a range of about 7 µm to about 30 µm.

38. The anode according to any of embodiments 1-37, wherein the continuous porous lithium storage layer is substantially free of nanostructures.

39. The anode according to any of embodiments 1-38, wherein the continuous porous lithium storage layer includes less than 1% by weight of carbon-based binders 40. The anode according to any of embodiment 1-39, wherein the anode has a total reflectance of at least 10% measured at 550 nm at a top surface of the anode.

41. The anode according to any of embodiments 1-40, wherein the continuous porous lithium storage layer comprises a metal from the metal oxide layer in an atomic % range of about 0.05% to about 5%.

42. The anode according to any of embodiment 1-41, wherein the current collector further comprises an electrically conductive layer, and the metal oxide layer is interposed between the electrically conductive layer and the continuous porous lithium storage layer.

43. The anode of embodiment 42, wherein the electrically conductive layer comprises stainless steel, titanium, nickel, copper, a conductive carbon, or a combination thereof.

44. The anode of embodiment 43, wherein the continuous porous lithium storage layer comprises a metal from the electrically conductive layer in an atomic % range of about 0.05% to about 5%.

45. A battery comprising the anode according to any of embodiment 1-44 and a cathode.

46. The battery of embodiment 45, further comprising one or more compression members configured to apply pressure on the anode in a direction toward the cathode, or configured to apply pressure on the cathode in a direction toward the anode, or both.

47. The lithium-ion battery of embodiment 45 or 46 wherein the anode is prelithiated and the cathode comprises sulfur, selenium, or both sulfur and selenium.

48. The lithium-ion battery of embodiment 47, wherein the cathode further comprises a first carbon material.

49. The lithium-ion battery of embodiment 48, wherein the cathode further comprises carbon nanotubes.

50. A method of making an anode for use in an energy storage device, the method comprising:
  providing a current collector comprising an electrically conductive layer and a metal oxide layer overlaying the electrically conductive layer, wherein the metal oxide layer has an average thickness of at least 0.01 µm; and
  depositing a continuous porous lithium storage layer onto the metal oxide layer by a CVD process.

51. The method of embodiment 50, wherein providing the current collector comprises:
  i) depositing a metal oxide precursor composition over the electrically conductive layer to form a deposited metal oxide precursor composition; and
  ii) forming the metal oxide layer using the deposited metal oxide precursor composition.

52. The method of embodiment 51, wherein the metal oxide precursor composition comprises a sol-gel, a metal carbonate, a metal acetate, a metal organic acetate, a metal hydroxide, a metal oxide dispersion, or a combination thereof.

53. The method of embodiment 52, wherein forming the metal oxide layer comprises thermally treating the deposited metal oxide precursor composition.

54. The method of embodiment 53, wherein thermally treating comprises exposing the deposited metal oxide precursor composition to a temperature in a range of 50° C. to 250° C., optionally for a time period in a range of 0.1 to 120 minutes.

55. The method according to any of embodiments 51-54, wherein forming the metal oxide layer comprises exposing the deposited metal oxide precursor composition to pressure in a range of 0.1 to 100 torr, optionally for a time period in a range of 0.1 to 120 minutes.

56. The method of embodiment 51, wherein the metal oxide precursor composition comprises metal-containing particles.

57. The method of embodiment 56, wherein forming the metal oxide layer comprises oxidizing the metal-containing particles.

58. The method of embodiment 57, wherein oxidizing comprises exposing the metal-particles to an oxygen-containing gas or a solution comprising a chemical oxidant.

59. The method according to any of embodiments 50-58, further comprising depositing lithium metal onto the metal oxide layer prior to depositing the continuous porous lithium storage layer.

60. The method of embodiment 59 wherein the lithium metal is deposited by evaporation, e-beam, or sputtering.

61. The method of embodiment 59 or 60, wherein a ratio of deposited lithium metal atoms to oxygen atoms in the metal oxide layer is in a range of 0.05 to 1.0.

62. The method according to any of embodiments 59-61, wherein an amount of deposited lithium metal is in a range of 2% to 50% of a maximum lithium areal capacity of the continuous porous lithium storage layer.

63. The method according to any of embodiments 1-62, further comprising forming a lithiated storage layer by incorporating lithium into the continuous porous lithium storage layer prior to a first electrochemical cycle when the anode is assembled into the energy storage device.

64. The method of embodiment 63, wherein lithium is incorporated prior to assembly of the energy storage device.

65. The method of embodiment 63 or 64, wherein incorporating lithium comprises depositing a lithiation material over the continuous porous lithium storage layer.

66 The method of embodiment 65, wherein the lithiation material comprises a reducing lithium compound, lithium metal, or a stabilized lithium metal powder.

67. The method of embodiment 65 or 66, further comprising applying heat or pressure to the anode during or after deposition of the lithiation material.

68. The method of embodiment 63 or 64, wherein incorporating lithium comprises contact of the anode with a lithiation material provided as a coating on a lithium transfer substrate.

69. The method of embodiment 68, wherein. the lithiation material comprises a reducing lithium compound, lithium metal, or a stabilized lithium metal powder.

70. The method of embodiment 68 or 69, further comprising applying heat or pressure to the anode during or after contacting.

71 The method according to any of embodiments 68-70, wherein the lithium transfer substrate functions as a current separator in an assembled battery 72. The method of embodiment 63 or 64 1, wherein incorporating lithium comprises contacting the continuous porous lithium storage layer with a solution comprising a reductive lithium organic compound.

73. The method of embodiment 63 or 64, wherein the lithium is incorporated electrochemically.

74. The method according to any of embodiments 63-73, further comprising forming a supplemental layer over the continuous porous lithium storage layer prior to forming a lithiated storage layer.

75. The method of embodiment 74, wherein the supplemental layer comprises silicon nitride, a metal oxide, a metal nitride, or a metal oxynitride.

76. The method according to any of embodiments 63-75, further comprising thermally treating the continuous porous lithium storage layer during the incorporating, after the incorporating, or both during and after the incorporating.

77. The method of embodiment 64, wherein forming a lithiated storage layer comprises:
(a) depositing a lithium metal layer over the continuous porous lithium storage layer; and
(b) depositing a lithium-ion conducting layer after depositing the lithium metal layer.

78. The method of claim 77, further comprising applying heat to the anode i) between steps (a) and (b), ii) after step (b), or iii) both (i) and (ii).

79. The method of embodiment 77 or 78, wherein the lithium ion-conducting layer comprises at least one of a lithium-containing material, a metal oxide or a metalcone.

80. The method according to any of embodiments 77-79, wherein the lithium ion-conducting layer comprises at least one of a lithium phosphorous oxynitride (LIPON), a lithium phosphate, a lithium aluminum oxide, a lithium lanthanum titanate, an alucone or a zircone.

81. The method according to any of embodiments 50-80, further comprising treating the anode with a reducing agent prior to battery assembly.

82. The method of embodiment 81, wherein the reducing agent has an electrochemical potential sufficient to reduce at least a portion of the metal oxide layer.

83. The method of embodiment 81 or 82, wherein the reducing agent comprises an inorganic hydride, a substituted or unsubstituted borohydride, an amine-borane, or an anionic organic aromatic compound.

84. The method according to any of embodiments 81-83, wherein treating the anode with the reducing agent comprises treating the anode with a non-aqueous solvent comprising the reducing agent.

85. The method according to any of embodiments 50-84, further comprising thermally treating the anode after depositing the continuous porous lithium storage layer and prior to battery assembly.

86. The method of embodiment 85, wherein the thermally treating includes heating the anode to a temperature in a range of 50° C. to 600° C. for a time period in a range of 0.1 min to 120 min.

87. The method of embodiment 85 or 86, wherein the thermally treating is conducted in an environment having a partial pressure of oxygen and water each less than 1 Torr.

88. The method of embodiment 85 or 86, wherein the thermally treating is conducted in an environment having a partial pressure of oxygen and water each less than 0.1 Torr.

89. The method according to any of embodiments 85-88, wherein the thermally treating includes heating the anode to a temperature in a range of 350° C. to 600° C. for a time period in a range of 0.1 min to 30 min.

90. The method according to any of embodiments 85-89, wherein the metal oxide layer comprises an oxide of nickel or an oxide of titanium.

91. The method according to any of embodiments 85-89, wherein the electrically conductive layer comprises copper and the metal oxide layer comprises an oxide of titanium having a thickness in a range of 0.01 μm to 0.20 μm.

92. The method according to any of embodiments 85-91, wherein the thermally treating includes transfer of the anode to an oven, exposure of the anode to a source of IR radiation, or contact of the anode with a heated surface.

93. The method according to any of embodiments 85-92, wherein the thermally treating increases the electrical conductivity of the continuous porous lithium storage layer.

94. The method according to any of embodiments 85-93, wherein the thermally treating increases the adhesion of the continuous porous lithium storage layer to the current collector.

95. The method according to any of embodiments 85-94, wherein the thermally treating forms an anode having a higher charge capacity in a lithium-ion battery cell than an equivalent anode not receiving the thermally treating step;

96. The method according to any of embodiments 85-95, wherein the thermally treating forms an anode capable of faster charging in a lithium-ion battery cell than an equivalent anode not receiving the thermally treating step.

97. The method according to any of embodiments 45-96, wherein the CVD process is a PECVD process.

98. The method of embodiment 97, wherein the continuous porous lithium storage layer has a total content of silicon, germanium, or a combination thereof of at least 40 atomic %.

99. The method of embodiment 97 or 98, wherein the continuous porous lithium storage layer comprises at least 85 atomic % amorphous silicon having a density in a range of about 1.1 g/cm$^3$ to 2.2 g/cm$^3$.

100. The anode according to any of embodiments 50-99, wherein the continuous porous lithium storage layer has a thickness of at least 3 μm.

101. The anode according to any of embodiments 50-100, wherein the continuous porous lithium storage layer has a thickness in a range of about 7 μm to about 30 μm.

102. The method according to any of embodiments 50-101, wherein the PECVD process comprises using silane gas and optionally hydrogen gas, wherein a ratio of hydrogen gas flow to silane gas flow is in a range of 0 to 2.

103. The method according to any of embodiments 50-102, wherein the PECVD process further comprises using a doping gas to dope the continuous porous lithium storage layer, wherein a ratio of doping gas flow to silane gas flow is in a range of 0.001 to 0.05.

104. The method of embodiment 103, wherein the doping gas is borane or phosphine.

105. The method according to any of embodiments 97-104, wherein the PECVD process is an expanding thermal plasma PECVD process or a hollow cathode tube PECVD process.

106. The method according to any of embodiments 97-105, wherein the PECVD process further comprises heating the current collector to a temperature in a range of 200° C. to 600° C. for at least a portion of the process.

107. The method according to any of embodiments 97-106, further comprising adding a source of oxygen, a source of nitrogen, or both, to silane gas after depositing at least 50% of the continuous porous lithium storage layer to form a lithium storage sublayer or a supplemental layer comprising a silicon nitride, a silicon oxide, or a silicon oxynitride.

108. The method of embodiment 107, wherein a supplemental layer is formed comprising silicon dioxide having a thickness in a range of about 10 nm to about 150 nm.

109. The method of embodiment 107, wherein a supplemental layer is formed comprising substantially stoichiometric silicon nitride having a thickness in a range of about 2 nm to about 50 nm.

110. The method according to any of embodiments 50-109, further comprising depositing one or more supplemental layers each comprising an independently selected metal compound.

111. The method according to embodiment 110, wherein the metal compound is a metal oxide, a metal nitride, a metal oxynitride, a lithium containing material, or a metalcone.

112. The method according to any of embodiments 50-111, wherein one or more deposition or thermal treatment steps are conducted using roll-to-roll manufacturing methods.

113. A lithium-ion battery comprising an anode made according to any of embodiments 50-112 and a cathode.

114. The lithium-ion battery of embodiment 113, wherein the anode comprises a lithiated storage layer and the cathode comprises sulfur, selenium, or both sulfur and selenium.

115. The lithium-ion battery of embodiment 114, wherein the cathode further comprises carbon nanotubes.

116. The lithium-ion battery of embodiment 114 or 115, wherein the lithiated storage layer includes lithium in a range of 50% to 100% of the theoretical lithium storage capacity of the continuous porous lithium storage layer.

117. A lithium-ion battery comprising an anode and a cathode, wherein the anode is prepared in part by applying at least one electrochemical charge/discharge cycle to a non-cycled anode, the non-cycled anode comprising i) an anode according any of embodiments 1-41, or an anode made according to any of embodiments 50-112.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Additionally, details of any specific embodiment may not always be present in variations of that embodiment or may be added to other embodiments.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the layer" includes reference to one or more layers and equivalents thereof known to those skilled in the art, and so forth. The invention has now been described in detail for the purposes of clarity and understanding. However, it will be appreciated that certain changes and modifications may be practiced within the scope of the appended claims.

All publications, patents, and patent applications cited herein are hereby incorporated by reference in their entirety for all purposes. None is admitted to be prior art.

We claim:

1. A prelithiated anode for use in a lithium-ion battery comprising:
   a current collector comprising a metal oxide layer; and
   a lithiated storage layer overlaying the metal oxide layer, wherein the lithiated storage layer:
   i) is formed by incorporating lithium into a continuous porous lithium storage layer comprising at least 80 atomic % silicon;
   ii) comprises less than 1% by weight of carbon-based binders; and iii) comprises lithium in an amount to provide a lithium storage capacity in a range of 1% to 90% of a theoretical lithium storage capacity of the continuous porous lithium storage layer.

2. The anode of claim 1, wherein the lithiated storage layer comprises lithium in an amount to provide a lithium storage capacity in a range of 1% to 10% of the theoretical lithium storage capacity.

3. The anode of claim 1, wherein the lithiated storage layer comprises lithium in an amount to provide a lithium storage capacity in a range of 10% to 30% of the theoretical lithium storage capacity.

4. The anode of claim 1, wherein the lithiated storage layer comprises lithium in an amount to provide a lithium storage capacity in a range of 30% to 50% of the theoretical lithium storage capacity.

5. The anode of claim 1, wherein the lithiated storage layer comprises lithium in an amount to provide a lithium storage capacity in a range of 50% to 70% of the theoretical lithium storage capacity.

6. The anode of claim 1, wherein the lithiated storage layer comprises lithium in an amount to provide a lithium storage capacity in a range of 70% to 90% of the theoretical lithium storage capacity.

7. The anode of claim 1, wherein the metal oxide layer has a thickness of at least 0.005 µm.

8. The anode of claim 1, wherein the metal oxide layer comprises a transition metal oxide.

9. The anode of claim 1, wherein the metal oxide layer comprises a doped conductive oxide.

10. The anode of claim 1, wherein the current collector comprises the metal oxide layer disposed over an electrically conductive layer.

11. The anode of claim 10, wherein the electrically conductive layer comprises a metal foil.

12. The anode of claim 10, wherein the electrically conductive layer comprises carbon nanotubes.

13. The anode of claim 1, wherein the continuous porous lithium storage layer comprises at least 85 atomic % amorphous silicon having a density in a range of 1.1 $g/cm^3$ to 2.25 $g/cm^3$.

14. The anode of claim 1, further comprising a supplemental layer disposed over the continuous porous lithium storage layer, wherein the supplemental layer comprises silicon nitride, a metal oxide, a metal nitride, or a metal oxynitride.

15. The anode of claim 1, further comprising a lithium-ion conducting layer disposed over the continuous porous lithium storage layer.

16. A battery comprising an anode, a cathode, and an electrolyte, wherein the anode is the prelithiated anode according to claim 1.

17. The battery of claim 16, wherein the electrolyte is a solid-state electrolyte.

18. The battery of claim 16, further comprising a separator between the anode and the cathode, wherein the electrolyte is a liquid electrolyte or a gel electrolyte.

19. The battery of claim 16, further comprising one or more compression members configured to apply pressure on the anode in a direction toward the cathode, or configured to apply pressure on the cathode in a direction toward the anode, or both.

* * * * *